United States Patent
Inoue et al.

(10) Patent No.: US 8,668,849 B2
(45) Date of Patent: *Mar. 11, 2014

(54) SPUTTERING TARGET, OXIDE SEMICONDUCTOR FILM AND SEMICONDUCTOR DEVICE

(75) Inventors: Kazuyoshi Inoue, Chiba (JP); Koki Yano, Chiba (JP); Masashi Kasami, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/468,119

(22) Filed: May 10, 2012

(65) Prior Publication Data

US 2012/0273777 A1    Nov. 1, 2012

Related U.S. Application Data

(62) Division of application No. 12/532,247, filed as application No. PCT/JP2008/053458 on Feb. 28, 2008, now Pat. No. 8,333,913.

(30) Foreign Application Priority Data

Mar. 20, 2007  (JP) ................ 2007-072596
Mar. 23, 2007  (JP) ................ 2007-076810

(51) Int. Cl.
*H01B 1/08* (2006.01)
*H01L 51/50* (2006.01)

(52) U.S. Cl.
USPC ............... 252/518.1; 252/519.51; 252/520.1; 252/521.2; 257/43

(58) Field of Classification Search
USPC .................. 252/518.1, 519.51, 520.1, 521.2; 257/43
See application file for complete search history.

(56) References Cited

U.S. PATENT DOCUMENTS

| 8,129,714 B2 * | 3/2012 | Yano et al. ............ 257/40 |
| 2006/0113539 A1 | 6/2006 | Masafumi et al. |
| 2007/0117237 A1 | 5/2007 | Inoue |
| 2007/0170434 A1 | 7/2007 | Inoue |
| 2007/0215945 A1 * | 9/2007 | Tokunaga et al. ........ 257/347 |

(Continued)

FOREIGN PATENT DOCUMENTS

| JP | 5238807 | 9/1993 |
| JP | 2000048966 | 2/2002 |

(Continued)

OTHER PUBLICATIONS

Nomura et al "Thin-film transistor fabricated in single-crystalline transparent oxide semiconductor", Science, vol. 300, (May 2003) 1269-72.*

Yaglioglu et al "Crystallization of amorphous $In_2O_3$-10 wt% ZnO thin films . . . ", Applied Phys. Lett. 86, 261908 (2005).*

(Continued)

*Primary Examiner* — Mark Kopec
(74) *Attorney, Agent, or Firm* — Millen, White, Zelano & Branigan, P.C.

(57) ABSTRACT

A sputtering target including an oxide sintered body, the oxide sintered body containing indium (In) and at least one element selected from gadolinium (Gd), dysprosium (Dy), holmium (Ho), erbium (Er) and ytterbium (Yb), and the oxide sintered body substantially being of a bixbyite structure.

18 Claims, 14 Drawing Sheets

(56) References Cited

U.S. PATENT DOCUMENTS

| | | | |
|---|---|---|---|
| 2008/0239217 A1 | 10/2008 | Inoue | |
| 2010/0117071 A1* | 5/2010 | Inoue et al. | 257/43 |
| 2011/0050733 A1* | 3/2011 | Yano et al. | 345/690 |
| 2012/0119206 A1* | 5/2012 | Wang et al. | 257/43 |
| 2012/0168748 A1* | 7/2012 | Yano et al. | 257/43 |
| 2012/0313057 A1* | 12/2012 | Itose et al. | 252/520.1 |

FOREIGN PATENT DOCUMENTS

| | | |
|---|---|---|
| JP | 2003298062 | 10/2003 |
| JP | 2004273614 | 9/2004 |
| JP | 2005292768 | 10/2005 |
| JP | 2006173580 | 6/2006 |
| WO | WO 2004105054 | 12/2004 |
| WO | WO 2005086179 | 1/2005 |
| WO | WO 2008053458 | 6/2008 |

OTHER PUBLICATIONS

Bagheri-Mohagheghi et al "The efect of high acceptor dopant concentration of Zn2+ on electrical, optical and structural properties of the In2O3 transparent conducting thin films", Semicond. Sci. Technol. 18 (2003) 97-103.*

Daijiten, H.Y. "Sodium contamination", The Nikkan Kogyo Shinbun, Ltd. Mar. 20, 1999. p. 795.

Tomei Dodenmaku no Gijutsu ($2^{nd}$ revised edition), Ohmusha, Ltd., Dec. 20, 2006, pp. 113-119 and 184-191.

Nakazawa, H. et al. "The electronic properties of amorphous and crystallized in 2O3 films" Journal of Applied Physics, 2006, 100: 093706-1-093706-8.

Nomura, K. et al. "Room-temperature fabrication of transparent flexible thin-film transistors using amorphous oxide semiconductors." International weekly journal of science Nature, 432:488-492. Nov. 25, 2004.

* cited by examiner

SPUTTERING TARGET, OXIDE SEMICONDUCTOR FILM AND SEMICONDUCTOR DEVICE

TECHNICAL FIELD

The invention relates to a sputtering target and an oxide semiconductor film. The invention relates to a semiconductor device, in particular, to a semiconductor device using as a semiconductor crystalline indium oxide having a prescribed electron carrier concentration.

BACKGROUND ART

An oxide semiconductor film composed of a metal composite oxide has a high degree of mobility and excellent visible light transmission, and is used as a switching element, a driving circuit element or the like for a liquid crystal display, a thin film electroluminescence display, an electrophoresis display, a moving powder display, etc.

As the oxide semiconductor film composed of such a metal composite oxide, a zinc oxide-based crystalline thin film (Patent Document 1) has attracted attention. However, zinc oxide has a defect that it lacks stability, and hence, a very few of them were put into practical use.

Non-patent Document 1 discloses a thin film transistor using an amorphous transparent semiconductor film composed of indium oxide, gallium oxide and zinc oxide. However, since this transparent semiconductor film is amorphous, it has poor stability.

In addition, the above-mentioned indium oxide contains a lot of oxygen deficiencies in its crystal, and therefore, is used as a transparent material improved in conductivity. However, when indium oxide is used as a material of an oxide semiconductor film, the amount of oxygen deficiency cannot be controlled. As a result, indium oxide becomes a conductive material, making the use thereof as a semiconductor of an oxide semiconductor film difficult.

The above-mentioned oxide semiconductor film composed of a metal composite oxide has further disadvantages that the field effect mobility is as low as 8 cm$^2$/V·sec or less and the on-off ratio of the current is small. In addition, a sputtering target used in producing the above-mentioned oxide semiconductor film has poor conductivity, and hence, a DC sputtering method, which is industrially advantageous, cannot be used, and hence, only a RF sputtering method can be used in producing the above-mentioned oxide semiconductor film. For these reasons, these oxide semiconductor films are not suited to practical use.

Furthermore, an active matrix-type image display apparatus such as a LCD (liquid crystal display) and an organic EL (Electro Luminescence) display has been widely used in view of display performance, energy saving or the like. In particular, it has come to almost constitute the mainstream as displays of cellular phones, PDAs (Personal Digital Assistant) and personal computers, laptop computers and TVs. Generally, a TFT (field-effect type thin film transistor) substrate is used in these displays.

For example, a liquid crystal display has a configuration in which a display material such as liquid crystal is filled between a TFT substrate and an opposing substrate, and a voltage is selectively applied to this display material for each pixel. Here, a TFT substrate means a substrate on which a TFT using a semiconductor thin film (also referred to as a semiconductor film) such as an amorphous silicon thin film or a polycrystalline silicon thin film is arranged as an active layer. The above-mentioned image display apparatus is driven by the active matrix circuit of a TFT. Since a TFT is arranged in the shape of an array, a TFT substrate is also referred to as a "TFT array substrate".

Meanwhile, in a TFT substrate used for a liquid crystal display or the like, a set of a TFT and one pixel of the screen of a liquid crystal display (this set is referred to as one unit) are arranged longitudinally and laterally on a glass substrate. In a TFT substrate, for example, a gate wire is arranged longitudinally at equal intervals on a glass substrate and a source wire or a drain wire are arranged laterally at equal intervals. In addition, a gate electrode, a source electrode, and a drain electrode are respectively formed in the above-mentioned unit which constitutes each pixel.

A transistor using the above-mentioned silicon thin film is produced by using a silane-based gas, and hence, it is disadvantageous in respect of safety or equipment cost. In addition, an amorphous silicon thin film has an electron mobility which is as low as about 0.5 cm$^2$/V·s when used in a TFT. In addition, since an amorphous silicon thin film has a small band gap, it may absorb visible rays to cause malfunction. Moreover, a polycrystalline silicon thin film requires a heating process which is conducted at relatively high temperatures, needs a large amount of energy cost, and it is hard to be formed directly on a large-sized glass substrate.

Under such circumstances, a TFT using an oxide semiconductor thin film in which a film can be formed at low temperatures has been actively developed. With the development of the above-mentioned TFT, a semiconductor device or the like using an oxide semiconductor thin film has also been developed. Further, in order to obtain a flat panel display (FPD) which is thinner, lighter in weight and higher in resistance to breakage, an attempt has been made to use a resin substrate or the like which is light in weight and flexible instead of a glass substrate.

For example, Patent Document 2 discloses a technology of a thin film transistor using an oxide semiconductor film composed mainly of zinc oxide which can be formed at low temperatures.

In addition, Patent Document 3 discloses a technology of a field effect transistor using as an active layer (channel layer) an amorphous oxide containing at least one of In, Zn and Sn.

However, the thin film transistor in Patent Document 2 is required to be improved in transparency or electric properties as a transistor or the like.

In addition, since the transparent semiconductor film used in the channel layer is amorphous, the field effect transistor of Patent Document 3 has problems that the characteristics thereof may change largely with time or by heat, or the threshold voltage may change greatly when used for a long period of time. In particular, in the production process, if a heat of 300° C. or higher is applied, for example, thermal changes in the characteristics thereof has become a great obstacle for industrialization. One of the reasons is that the number of careers is too large or that the film is amorphous. Another reason is that the move of oxygen tends to occur easily and the carrier concentration tends to change easily since oxygen is forced to be included in order to increase the partial oxygen pressure at the time of film forming.

In addition, it is difficult to control an amorphous transparent semiconductor thin film, since a large amount of oxygen tends to be introduced at the time of film formation. As a result, the carrier concentration tends to change with the passage of time or by environmental temperatures. For this reason, it is necessary to control accurately the oxygen partial pressure at the time of film formation. Therefore, an amorphous transparent semiconductor film is defective in reproducibility, stability or the like for industrialization.

Furthermore, since this transparent semiconductor membrane is amorphous, its resistance to chemicals such as an etching solution, the representative example of which is PAN, is low, a metal wiring on the semiconductor film cannot be subjected to wet etching. Moreover, it has a defect that the refractive index is large and light transmittance of a multi-layer film is lowered easily. In addition, since this transparent semiconductor thin film is amorphous, it may adsorb oxygen, water, or the like in an atmospheric gas, whereby electrical properties of the film may be changed and thus the yield may be lowered.

That is, an amorphous oxide has a problem that control of electron career density is difficult, and hence it is poor in stability, uniformity, reproducibility, heat resistance and durability.

Patent Document 1: JP-A-2004-273614
Patent Document 2: JP-A-2003-298062
Patent Document 3: JP-A-2006-173580
Non-Patent Document 1: NATURE, vol. 432, p488-492, (2004)

An object of the invention is to provide a sputtering target which can be crystallized at relatively low temperatures and is capable of producing an oxide semiconductor film having stable semiconductor properties.

Another object of the invention is to provide a sputtering target which is improved in conductivity and can form a film by using a DC sputtering method.

The invention has been made in view of the above-mentioned problems, and is aimed at providing a semiconductor device improved in transparency, electric properties, stability, uniformity, reproducibility, heat resistance, durability or the like.

DISCLOSURE OF THE INVENTION

The inventors made studies on an indium oxide-gallium oxide-zinc oxide (IGZO) semiconductor, and as a result, the inventors have found that, generally, IGZO forms a stable amorphous phase. Further, since most of the IGZO compositions show an amorphous phase, an IGZO semiconductor does not show stable semiconductor properties at high temperatures.

In the case of indium oxide alone, oxygen deficiency may tend to occur easily. As a result, a large number of carrier electrons generate, which makes it difficult to render the electron conductivity small. Therefore, when no transistor gate voltage is applied, a large amount of current tends to be flown between a source terminal and a drain terminal, and a TFT cannot realize a normally-off operation. In addition, it appears that increasing an on-off ratio is also difficult.

Furthermore, when indium oxide with an electron carrier concentration of $10^{18}/cm^3$ or more is used in a channel layer of a TFT, a sufficiently large on-off ratio cannot be attained. Accordingly, it is not suited to a normally-off TFT.

That is, in conventional crystalline oxide indium films, it was impossible to obtain a film with an electron carrier concentration of less than $10^{18}/cm^3$.

The inventors prepared a TFT in which crystalline indium oxide with an electron carrier concentration of less than $10^{18}/cm^3$ is used as an active layer of a field-effect transistor. The inventors have found that a TFT with desired properties could be obtained, which can be applied to an image display apparatus such as a light-emitting apparatus.

Further, the inventors made intensive and extensive studies on crystalline oxide indium containing at least one of Zn, Mg, Ni, Co and Cu or crystalline oxide indium containing B, Al, Ga, Sc, Y and a lanthanoid element, and film-forming conditions of this material. As a result, the inventors have found that, by containing at least one of Zn, Mg, Ni, Co and Cu, or by containing at least one of B, Al, Ga, Sc, Y and a lanthanoid element, the electron carrier concentration of crystalline oxide indium can be less than $10^{18}/cm^3$.

In order to attain the above-mentioned object, the semiconductor device according to the second aspect of the invention is a semiconductor device in which a crystalline oxide containing indium is used as a semiconductor, and the crystalline oxide has an electron carrier concentration of less than $10^{18}/cm^3$.

As mentioned above, by using as a semiconductor a crystalline oxide which has properties superior to those of an amorphous oxide, it is possible to improve stability, uniformity, reproducibility, heat resistance, durability or the like of a semiconductor device. In addition, when a semiconductor device is a field-effect transistor such as a TFT, it is possible to provide a transistor improved in transparency, electric characteristics, large-area-uniformity, reproducibility or the like. Here, the semiconductor device means semiconductor elements, semiconductor components, semiconductor apparatuses, integrated circuits or the like.

It is preferred that the above-mentioned crystalline oxide be a nondegenerate semiconductor.

In this way, it is possible to reduce an on-off current and to increase an on-off ratio.

The nondegenerate semiconductor means a semiconductor which shows nondegenerated conduction. Here, the nondegenerate conduction means a state in which thermal activation energy in the temperature dependence of electrical resistance is 30 meV or more.

It is preferred that the crystalline oxide contain a positive divalent element.

Presence of a positive divalent element has an effect of extinguishing carriers generated by oxygen deficiency, whereby the electron carrier concentration can be decreased.

In addition, although being smaller than the electron mobility of a single crystal, the electron mobility of a thin film formed of a crystalline oxide can be large.

Further, in the case of a thin film composed of a crystalline oxide, oxygen is fixed more stably. In addition, it has a high field-effect mobility, and the composition range for a stable crystalline oxide can be expanded.

It is further preferred that the positive divalent element be at least one element of Zn, Mg, Ni, Co and Cu.

In this way, indium is solid-solution-substituted by at least part of a positive divalent element such as zinc, whereby the electron carrier concentration can be effectively suppressed.

Further, it is preferred that an atomic ratio of the number of the atoms of the positive divalent element ([M2]) to the number of the atoms of total metal elements contained the crystalline oxide ([A]) is $0.001 \leq [M2]/[A] < 0.2$.

With this range, it is possible to obtain a more stable crystalline oxide. In addition, the electron carrier concentration can be controlled to be less than $10^{18}/cm^3$.

Further, it is preferred that, by at least varying the atomic ratio of [M2] to [A], the electron mobility to the electron carrier concentration of the crystalline oxide logarithmically proportionally increase.

In this way, semiconductor properties can be set easily, and the added value of a semiconductor can be improved.

It is also preferred that the crystalline oxide contain a positive trivalent element other than the above-mentioned indium.

Presence of the positive trivalent element has an effect of suppressing generation of oxygen deficiency. In addition, by using a positive divalent element and a positive trivalent element simultaneously, carrier generation can be suppressed further effectively.

In addition, although being smaller than the electron mobility of a single crystal, the electron mobility of a thin film formed of a crystalline oxide can be large.

Further, in the case of a thin film composed of a crystalline oxide, oxygen is fixed more stably. In addition, it has a high field-effect mobility, and the composition range for a stable crystalline oxide can be expanded.

It is also preferred that the positive trivalent element be at least one element of B, Al, Ga, Sc, Y and a lanthanoid element.

In this way, the crystalline oxide can be effectively stabilized due to strong ion binding properties of B, Al, Ga, Sc, Y and a lanthanoid element.

As examples of a lanthanoid element, La, Nd, Sm, Eu, Gd, Dy, Ho, Er, Tm, Yb, Lu or the like can be given.

It is preferred that an atomic ratio of the number of the atoms of the positive trivalent element ([M3]) to the number of the atoms of total metal elements contained the crystalline oxide ([A]) is $0.001 \leq [M3]/[A] < 0.2$.

With this range, it is possible to obtain a very stable crystalline oxide. In addition, the electron carrier concentration can be controlled to less than $10^{18}/cm^3$.

Further, it is preferred that, by at least varying the atomic ratio of [M3] to [A], the electron mobility to the electron carrier concentration logarithmically proportionally increase.

In this way, semiconductor properties can be set easily, and the added value of a semiconductor can be improved.

Further, it is preferred that the crystalline oxide have resistance to PAN.

In this way, the degree of freedom in the production process is improved, whereby the semiconductor device can be produced efficiently.

It is preferred that the concentration of Li and Na in the crystalline oxide be 1,000 ppm or less.

In this way, the properties change only slightly even when driven for a long period of time, whereby the reliability of the transistor can be improved.

It is preferred that the crystalline oxide be used as a channel layer in a field-effect transistor.

In this way, the stability, uniformity, reproducibility, heat resistance, durability or the like of a field-effect transistor can be improved.

The invention has been made in view of the above-mentioned problem. It has been found that a sputtering target which contains indium, and at least one element selected from gadolinium, dysprosium, holmium, erbium and ytterbium is capable of producing an oxide semiconductor film which is crystallized at relatively low temperatures and suffers from a slight degree of oxygen deficiency, whereby the invention has been completed.

The invention provides the following semiconductor device, sputtering target and oxide semiconductor film.

1. A sputtering target formed of an oxide sintered body,
the oxide sintered body comprising indium (In) and at least one element selected from gadolinium (Gd), dysprosium (Dy), holmium (Ho), erbium (Er) and ytterbium (Yb), and
the oxide sintered body substantially being of a bixbyite structure.

2. The sputtering target according to 1, wherein an atomic ratio represented by M/(In+M) is 0.01 to 0.25, wherein M is the content of gadolinium (Gd), dysprosium (Dy), holmium (Ho), erbium (Er) and ytterbium (Yb).

3. The sputtering target according to 1 or 2, wherein the sputtering target further comprises a positive divalent metal element and the content of the positive divalent metal element to the total amount of metal elements contained in the sputtering target is 1 to 10 at %.

4. The sputtering target according to 3, wherein the positive divalent metal element is zinc (Zn) and/or magnesium (Mg).

5. The sputtering target according to any one of 1 to 4, wherein the sputtering target further comprises a metal element with an atomic valency of positive tetravalency or higher, wherein the content of the metal element with an atomic valency of positive tetravalency or higher to the total metal elements contained in the sputtering target is 100 ppm to 2000 ppm in atomic ratio.

6. The sputtering target according to 5, wherein the metal element with an atomic valency of positive tetravalecy or higher metal element is at least one element selected from germanium (Ge), titanium (Ti), zirconium (Zr), niobium (Nb) and cerium (Ce).

7. An oxide semiconductor film comprising indium (In) and at least one element selected from gadolinium (Gd), dysprosium (Dy), holmium (Ho), erbium (Er) and ytterbium (Yb), and
the oxide semiconductor film substantially being of a bixbyite structure.

8. The oxide semiconductor film according to 7, wherein an atomic ratio represented by M/(In +M) is 0.01 to 0.25, wherein M is the content of gadolinium (Gd), dysprosium (Dy), holmium (Ho), erbium (Er) and ytterbium (Yb).

9. The oxide semiconductor film according to 7 or 8, wherein the oxide semiconductor film further comprises a positive divalent metal element, wherein the content of the positive divalent metal element to the total metal elements contained in the oxide semiconductor film is 1 to 10 at %.

10. The oxide semiconductor film according to 9, wherein the positive divalent metal element is zinc (Zn) and/or magnesium (Mg).

11. The oxide semiconductor film according to any one of 7 to 10, wherein the oxide semiconductor film further comprises a metal element with an atomic valency of positive tetravalency or higher, and the content of the metal element with an atomic valency of tetravalency or higher to the total metal elements contained in the oxide semiconductor film is 100 ppm to 2000 ppm in atomic ratio.

12. The oxide semiconductor film according to 11, wherein the metal with an atomic valency of positive tetravalency or higher is at least one element selected from germanium (Ge), titanium (Ti), zirconium (Zr), niobium (Nb) and cerium (Ce).

13. A semiconductor device using a crystalline oxide comprising indium as a semiconductor, wherein the crystalline oxide has an electron career concentration of less than $10^{18}/cm^3$.

14. The semiconductor device according to 13, wherein the crystalline oxide is a nondegenerate semiconductor.

15. The semiconductor device according to 13 or 14, wherein the crystalline oxide comprises a positive divalent element.

16. The semiconductor device according to 15, wherein the positive divalent element is at least one element of Zn, Mg, Ni, Co and Cu.

17. The semiconductor device according to 15 or 16, wherein the atomic ratio of the number of the atoms of the positive divalent element ([M2]) to the number of the atoms of total metal elements contained in the crystalline oxide ([A]) is 0.001 [M2]/[A]<0.2.

18. The semiconductor device according to 17, wherein the electron mobility to the electron carrier concentration of the crystalline oxide logarithmically proportionally increases by at least changing the atomic ratio of [M2] to [A].
19. The semiconductor device according to any one of 13 to 18, wherein the crystalline oxide comprises a positive trivalent element other than indium.
20. The semiconductor device according to 19, wherein the positive trivalent element is at least one element of B, Al, Ga, Sc, Y and a lanthanoid element.
21. The semiconductor device according to 19 or 20, wherein the atomic ratio of the number of the atoms of the positive trivalent element ([M3]) to the number of the atoms of total metal elements contained in the crystalline oxide ([A]) is 0.001 [M3]/[A]<0.2.
22. The semiconductor device according to 21, wherein the electron mobility to the electron carrier concentration of the crystalline oxide logarithmically proportionally increases by at least changing the atomic ratio of [M3] to [A].
23. The semiconductor device according to any one of 13 to 22, wherein the crystalline oxide has a PAN resistance.
24. The semiconductor device according to any one of 13 to 23, wherein the concentration of Li and Na contained in the crystalline oxide is 1000 ppm or less.
25. The semiconductor device according to any one of 13 to 24, wherein the crystalline oxide is used as a channel layer in a field-effect transistor.

According to the invention, it is possible to provide a sputtering target capable of producing an oxide semiconductor film which can be crystallized at relatively low temperatures and has stable semiconductor properties.

According to the invention, it is possible to provide a sputtering target which is improved in conductivity and is capable of forming a film by a DC sputtering method.

According to the invention, it is possible to provide a semiconductor device improved in transparency, electrical properties, stability, uniformity, reproducibility, heat resistance, durability or the like by using a crystalline oxide having properties which are more improved as compared with an amorphous oxide.

BEST MODE FOR CARRYING OUT THE INVENTION

Figure 1:
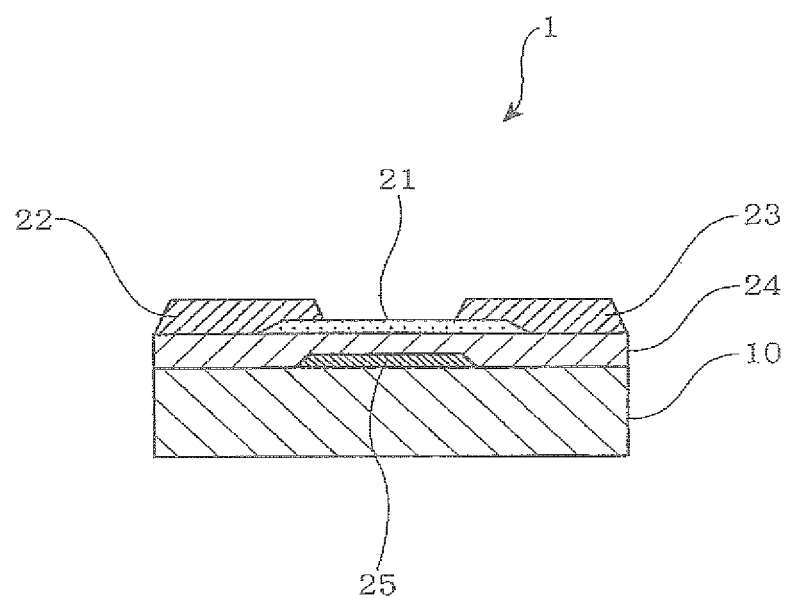
FIG. 1 is a schematic cross-sectional view of essential parts of a field-effect thin film transistor which is a semiconductor device according to one embodiment in the second aspect of the invention.

The sputtering target and the oxide semiconductor film in the first aspect of the invention will be described below.

The sputtering target of the invention (hereinafter, often abbreviated as "the target of the invention") is an oxide sintered body containing indium (In) and at least one element selected from gadolinium (Gd), dysprosium (Dy), holmium (Ho), erbium (Er) and ytterbium (Yb), and the oxide sintered body is substantially of a bixbyite structure.

When the target of the invention contains an element other than indium (In), gadolinium (Gd), dysprosium (Dy), holmium (Ho), erbium (Er) and ytterbium (Yb), crystals having a structure other than a bixbyite structure may be generated in the target, and the career mobility of the oxide semiconductor film may be lowered.

A bixbyite structure will be explained. A bixbyite is also called a rare-earth oxide C type or $Mn_2O_3(I)$ type oxide. As described in "Technology of Transparent Conductive Film", (published by Ohmsha, edited by the Japan Science and Technology Agency, 166 committee on Transparent Oxide and Photoelectronic Material, 1999 and so on), the stoicheiometric ratio of a bixbyite is shown by $M_2X_3$ (M is a cation and X is an anion, normally an oxygen ion) and an unit cell is constituted by 16 $M_2X_3$ molecules, i.e. 80 atoms in total (M: 32 and X: 48). Of these, the bixbyite structure compound, which is the component constituting the target of the invention, is shown by $In_2O_3$, i.e., a compound showing No. 06-0416 peak pattern or a pattern similar (shifted) to this in JCPDS (Joint Committee on Powder Diffraction Standards) database in an X-ray diffraction. In addition, the bixbyite structure compound includes a substitutional solid solution in which part of atoms and ions contained in a crystal structure is substituted by other atoms, or an interstitial solid solution in which other atoms are added into interstitial sites.

Crystal states of compounds contained in a sintered body can be determined by observing the sample collected from a sintered body by an X-ray diffraction.

In the invention, "the sintered body being substantially of a bixbyite structure" means a case where only a peak derived from a bixbyite structure compound is observed in an X-ray diffraction.

In the target of the invention, an atomic ratio represented by M/(In +M) is preferably 0.01 to 0.25, wherein M is the content of gadolinium (Gd), dysprosium (Dy), holmium (Ho), erbium (Er) and ytterbium (Yb).

When the atomic ratio of M/(In +M) is less than 0.01, the oxide semiconductor film may not be sufficiently stable. When the atomic ratio of M/(In +M) exceeds 0.25, the target may become an insulating body.

The target of the invention further contains a positive divalent metal element. Stable semiconductor properties can be attained even when a crystalline oxide semiconductor film obtained from the target is a thin film if the target contains the positive divalent metal element.

The content of the positive divalent metal element is preferably 1 to 10 at % relative to the total metal elements contained in the sputtering target. When the content is less than 1 at %, effects brought by the positive divalent metal element may be small. On the other hand, when the content exceeds 10 at %, it may be difficult for the oxide semiconductor film to crystallize.

Examples of the positive divalent metal element include Co, Ni, Cu, Pg, Pt, Ag, Au, Zn and Mg. Preferred are Zn and Mg.

The type of the positive divalent metal element does not limited to one, and one or a plural kinds of the positive divalent metal elements may be contained in the target of the invention.

Preferably, an alkaline earth metal element other than Mg and an alkali metal element are not contained. The content of the alkaline earth metal element other than Mg and the alkali metal element is 100 ppm or less, preferably 10 ppm or less, and more preferably 1 ppm or less, relative to the total metal elements contained in the sputtering target. When the target contains the above-mentioned metal element in an amount exceeding 100 ppm, in the case where the oxide semiconductor film obtained from the target is driven as a transistor, the semiconductor properties may vary during driving the transistor for a long period of time, whereby the on/off ratio and the driving threshold voltage may vary.

The target of the invention preferably further contains a metal element with an atomic valency of positive tetravalency or higher. A bulk resistance of the target can be decreased when the target contains a metal element with an atomic valency of positive tetravalency or higher, whereby the conductivity of the target increases and stable sputtering can be conducted even by a DC sputtering method.

The content of the metal element with an atomic valency of tetravalency or higher is preferably 100 to 2000 ppm in atomic ratio relative to the total metal elements contained in the sputtering target. When the content is less than 100 ppm, effects brought by the metal with an atomic valency of positive tetravalency or higher may be small. On the other hand, when the content exceeds 2000 ppm, carriers may be generated in the oxide semiconductor film obtained from the target, whereby carrier control may become difficult.

Examples of the metal element with an atomic valency of positive tetravalency or higher include Sn, Zr, Ge, Ti, Ce, Nb, Ta, Mo and W, with Ge, Ti, Zr, Nb and Ce being preferable.

An oxide semiconductor film obtained by using the sputtering target of the invention can be crystallized at a relatively low temperature as mentioned below. In such an oxide semiconductor film, the metal element with an atomic valency of tetravalency or higher contained in the target is preferably a metal element which does not function as a dopant. The metal element which does not function as a dopant is one having an effect of decreasing the bulk resistance (not increasing carriers) in the crystalline oxide semiconductor film. The metal element with an atomic valency of positive tetravalecy or higher having such effects includes Ti, Zr, Nb and Ce. The metal element with an atomic valency of positive tetravaleny or higher which does not decrease the carrier mobility of the crystalline oxide semiconductor film are Nb and Ce.

The type of the metal element with an atomic valency of positive tetravalency or higher does not limited to one, and one or a plural kinds of a metal element with an atomic valency of positive tetravalency or higher may be contained in the target of the invention.

The sputtering target of the invention consists essentially of an oxide consisting of indium (In), and at least one element selected from gadolinium (Gd), dysprosium (Dy), holmium (Ho), erbium (Er) and ytterbium (Yb), and optionally a positive divalent metal element and/or a metal element with an atomic valency of positive tetravalency or higher. Alternatively, the sputtering target of the invention may consist thereof. The term "consist essentially of" means that the sputtering target of the invention is formed of an oxide comprising indium (In), and at least one element selected from gadolinium (Gd), dysprosium (Dy), holmium (Ho), erbium (Er) and ytterbium (Yb), and optionally a positive divalent metal element and/or a metal element with an atomic valency of positive tetravalency or higher, and other components may be contained therein within a range which does not impair the advantageous effects of the invention.

The sputtering target of the invention can be prepared by mixing and pulverizing material powders (raw material powders comprising indium oxide, at least one of gadolinium oxide, dysprosium oxide, holmium oxide, erbium oxide and ytterbium oxide to obtain a mixture, molding the mixture into a desired shape to obtain a shaped body, and sintering the shaped body.

In the above-mentioned method for producing a sputtering target of the invention, it is preferable to further add a material containing a positive divalent metal element and/or a metal element with an atomic valency of tetravalency or higher to the above-mentioned raw material powers.

As examples of the material containing a positive divalent metal element and/or a metal element with an atomic valency of positive tetravalency or higher, metals themselves or oxides of the above-mentioned positive divalent metal element and metal element with an atomic valency of positive tetravalency or higher can be used.

As for the positive divalent metal element and/or the metal element with an atomic valency of positive tetravalency or higher to be added, one or a plural kinds may be appropriately selected from the above-mentioned positive divalent metal elements and/or metal elements with an atomic valency of positive tetravalency or higher.

In the raw material powder, as for the amount ratio of a compound selected from indium oxide, gadolinium oxide, dysprosium oxide, holmium oxide, erbium oxide and ytterbium oxide, mixing is conducted such that the atomic ratio shown by M/(In +M) becomes 0.01 to 0.25 wherein M is the content of gadolinium, dysprosium, holmium, erbium and ytterbium.

When a material containing a positive divalent metal element is added to the raw material powder, the material containing the positive divalent metal element is added such that the amount of the positive divalent metal element becomes 1 to 10 at % relative to the total metal elements in the raw material powder.

When a material with a metal element with an atomic valency of positive tetravalency or higher is added to the raw material powder, the material containing the metal element with an atomic valency of positive tetravalency or higher is added such that the amount of the metal element with an atomic valency of positive tetravalency or higher becomes 100 to 2000 ppm in atomic ratio relative to the total metal elements in the raw material powder.

In the method for producing the sputtering target of the invention, other components may be added insofar as the advantageous effects of the invention are not impaired.

After pulverizing the raw material powder by a dry beads mill or the like, for example, the pulverized raw material is then molded into a desired shape. For molding, known molding methods such as pressure molding and cold isostatic pressing or the like can be applied.

Subsequently, the molded product which has been shaped into a desired shape is sintered to obtain a sintered body. It is preferred that sintering be performed at 1200 to 1700° C. for 2 to 100 hours.

If sintering temperature is less than 1200° C., sintering density is not increased, and the resistance value of the target itself is lowered, and abnormal discharge or the like may occur during sputtering. If the sintering temperature exceeds 1700° C., indium oxide is decomposed. As a result, the target may be cracked, making the target production impossible.

This sintered body is substantially of a bixbyite structure. This can be confirmed from the fact that only a peak derived from a bixbyite structure compound is observed as a result of an X-ray diffraction analysis of the sintered body.

The sputtering target of the invention can be produced by polishing or the like the above-mentioned sintered body. As the method of polishing, known polishing technique such as mechanical polishing, chemical polishing, mechano-chemical polishing (combination of mechanical polishing and chemical polishing) or the like may be used.

In the method for producing the sputtering target of the invention, the resulting sputtering target may be subjected to a cleaning treatment.

As the cleaning treatment, air blowing, cleaning with running water or the like can be given. For example, if cleaning is conducted by air blow (removal of foreign matters), foreign matters can be removed more effectively if air intake is conducted by means of a dust collector from the side opposite to the air blow nozzle.

If a thin film is formed by using the sputtering target of the invention, an oxide semiconductor film of the invention can be produced by further subjecting this thin film to a heat treatment.

As the film-forming method, the RF magnetron sputtering method, DC magnetron sputtering method, electron beam deposition method, ion plating method or the like can be used. Since the sputtering target of the invention has improved conductivity, it is possible to use the DC magnetron sputtering method which is industrially advantageous.

The above-mentioned sputtering can be conducted in an inactive gas atmosphere such as 100% argon gas. It is also possible to conduct sputtering in an argon gas atmosphere to which a slight amount of oxygen (about 20% of the sputtering gas) is added.

The oxide semiconductor film can be crystallized by heating at relatively low temperatures. Heating is normally conducted at 150° C. to 400° C., preferably 180° C. to 300° C., and more preferably 200° C. to 250° C.

Heat treatment is preferably conducted for 1 minute to 10 hours.

The above-mentioned heat treatment may be conducted in an air or while supplying oxygen. As a result, the resulting oxide semiconductor film can have a more stable oxide structure.

In addition, the above-mentioned heat treatment can be conducted by heating the substrate of a thin film during the formation of the thin film. Heat treatment can be conducted by heating the substrate after forming a thin film and processing such as etching or the like.

The oxide semiconductor film of the invention as obtained above contains indium, and at least one element selected from gadolinium, dysprosium, holmium, erbium and ytterbium, and is substantially of a bixbyite structure.

The oxide semiconductor film of the invention can be crystallized at relatively low temperatures, and hence, can stabilize oxygen in the crystal. That is, the oxide semiconductor film of the invention suffers only a slight degree of oxygen deficiency. Accordingly, in the oxide semiconductor film of the invention, it is possible to suppress generation of carriers caused by oxygen deficiency. For example, the oxide semiconductor film of the invention has stable semiconductor properties, i.e., having a carrier density of $1.0\times E^{17}$ cm$^{-3}$ order or less, an on/off ratio of $10^4$ order or more and showing normally-off properties.

The semiconductor device in the second aspect of the invention will be described in detail.

[One Embodiment of the Semiconductor Device]

FIG. 1 is a schematic cross-sectional view of essential parts of a field-effect thin film transistor which is a semiconductor device according to one embodiment of the invention.

In FIG. 1, a field-effect thin film transistor 1 (hereinafter abbreviated as a "TFT1") is provided with a gate electrode 25 formed on a glass substrate 10, a gate-insulating film 24 formed on the glass substrate 10 and gate electrode 25, a crystalline oxide 21 as the channel layer formed on the gate-insulating film 24 above the gate electrode 25, and the source electrode 22 and the drain electrode 23 formed separately on the crystalline oxide 21 and the gate-insulating film 24.

The TFT 1 is not limited to the bottom-gate type TFT as mentioned above, and a TFT with various configurations such as a top-gate type TFT may be used. The substrate on which the TFT 1 is formed is not limited to the transparent glass substrate 10, and it may be a resin substrate and a resin film having flexibility. It may be a semitransparent or light-shielding substrate.

In the TFT1, the crystalline oxide 21 containing In (indium) is used as an N-type semiconductor (a channel layer in this embodiment). The electron carrier concentration of the crystalline oxide 21 is less than $10^{18}$/cm$^3$. The reason for allowing the electron carrier concentration to be less than $10^{18}$/cm$^3$ is that, if the crystalline oxide 21 with an electron carrier concentration of $10^{18}$/cm$^3$ or more is used as the channel layer of the TFT1, the on-off ratio cannot be increased sufficiently. If no gate voltage is applied to the TFT1, a large amount of current tends to be flown between the source electrode 22 and the drain electrode 23, and a normally-off operation cannot be attained. That is, as the active layer of the TFT1, when the TFT1 in which the crystalline oxide 21 with an electron carrier concentration of less than $10^{18}$/cm is used, the TFT1 with desired properties can be obtained.

The electron carrier concentration of the crystalline oxide 21 of the invention is a value measured at room temperature. The room temperature is, for example, 25° C. Specifically, it is a temperature which can be appropriately selected from a range of about 0 to 40° C. The electron carrier concentration of the crystalline oxide 21 according to the invention is not necessarily less than $10^{18}$/cm$^3$ in the entire temperature range of about 0 to 40° C. For example, it suffices that a carrier electron concentration of less than about $10^{18}$/cm$^3$ be realized at 25° C. In addition, preferably, the carrier electron concentration is further lowered to about $10^{17}$/cm$^3$ or less, more preferably about $10^{16}/cm^3$ or less. With this range, a normally-off TFT1 can be obtained in a high yield.

The lower limit of the electron carrier concentration in the crystalline oxide 21 is not particularly limited as long as it can be applied as the channel layer of a TFT. Therefore, in the invention, by controlling materials, composition ratio, production conditions, post-treatment conditions or the like of the crystalline oxide as in the examples mentioned later, for example, the electron carrier concentration is allowed to be $10^{12}/cm^3$ or more and less than $10^{18}/cm^3$. Further, it is preferred that the electron carrier concentration be $10^{13}/cm^3$ or more and $10^{17}/cm^3$ or less, more preferably $10^{15}/cm^3$ or more and $10^{16}/cm^3$ or less. With this range, a normally-off TFT1 having prescribed electron mobility can be obtained in a high yield.

The electron carrier concentration can be measured by the Hall effect measurement. It is preferred to perform the AC Hall measurement when measuring an electron carrier concentration of less than about $10^{17}/cm^3$. The reason therefor is that, in the case of the DC Hall measurement, there is a large degree of variation in measurement values, which may cause measurement reliability to be deteriorated.

The channel layer of the TFT1 (semiconductor thin film) is a thin film containing a crystalline substance (that is, the crystalline oxide 21). As for the crystalline oxide 21, at least part or all of the semiconductor thin film is crystalline. As a result, as compared with the case where the semiconductor thin film is amorphous, the carrier concentration can be decreased or controlled easily, and the operation of the TFT1 becomes stable. As a result, the performance of the TFT1 such as stability, uniformity, reproducibility, heat resistance and durability can be improved.

The crystalline substance to be contained in the thin film may be either single crystalline or polycrystalline (including an epitaxial film). A polycrystalline film which is easily manufactured on the industrial basis and can be increased in area is preferable. A polycrystal is preferable, since a single crystal film may have cracks by bending or impact during the production process or use. In the invention, the crystalline oxide 21 means an oxide showing specific diffraction lines in X-ray diffraction spectrum. An amorphous oxide means an oxide showing halo pattern and no specific diffraction lines.

Furthermore, it is preferred that the energy band gap between the conduction band and the valence band of the semiconductor thin film according to the present invention be about 2.8 eV or more. Due to such a band gap, a disadvantage that electrons of the valence band are excited to allow current leakage to occur frequently by the irradiation with visible rays can be effectively avoided.

It is preferred that the crystalline oxide 21 be a non-degenerate semiconductor.

In this way, an off current can be rendered small and an on/off ratio can be rendered large.

The above-mentioned crystalline oxide 21 contains a positive divalent element.

Due to the presence of the positive divalent element, the electron carrier concentration can be decreased due to the effects of extinguishing carriers caused by oxygen deficiency. In addition, as known by ITO or the like, the average free process of carriers does not depend on the size of the crystal particles, since it is smaller than the size of crystalline particles in the crystalline state. For this reason, the crystalline oxide 21 can be a crystalline thin film with a high electron mobility. In addition, since the added element is a divalent metal element, it cannot be a scattering factor, the electron mobility can be kept high.

The electron mobility of a thin film formed of the crystalline oxide 21 is inferior to that of a single crystal, but the thin film can have a great electron mobility. Further, by containing a positive divalent element, a thin film composed of the crystalline oxide 21 can be more stabilized. In addition, it has a high field effect mobility, and the composition range for a stable crystalline oxide can be expanded.

In the meantime, the above-mentioned positive trivalent element and the above-mentioned positive divalent element respectively mean an element which can take positive trivalence and positive divalence, respectively in the ionic state.

It is preferred that the above-mentioned positive divalent element be at least one element selected from Zn, Mg, Ni, Co and Cu.

In this way, indium is solid-solution-substituted by at least part of a positive divalent element such as zinc, whereby the electron carrier concentration can be effectively lowered. There are no restrictions on the solid-solution-substituted amount of a metal such as zinc. It suffices that part of the metal be solid-solution-substituted. The crystalline oxide 21 may be an oxide mixture.

Zinc and other divalent metals such as Mg, Ni, Co and Cu may be added simultaneously. For example, when Zn and Mg are added simultaneously, as compared with the case where Zn is added alone, the electron mobility is increased. The degree of increase in electron mobility is about 10 $cm^2/(V \cdot sec)$ at room temperature. It is an increase which is larger than an amorphous silicon by one digit. Further, when film formation is conducted at the same conditions, electronic resistivity increases with an increase in the Mg content, whereby electron mobility decreases. It is preferred that the content of a positive divalent element composed of Zn and Mg be exceeding 0.5 at % and less than 10 at %. The reason therefor is as follows. If the content of the positive divalent element is less than 0.5 at %, the electric resistance cannot be improved even when crystallized. If the content of the positive divalent element is 10 at % or more, it cannot be crystallized easily, and it becomes necessary to set a high crystallization temperature. As a result, a large amount of energy is consumed, which is economically disadvantageous.

Further, it is preferred that the atomic ratio of the number of atoms of the positive divalent element ([M2]) to the number of atoms of the total metal element ([A]) contained in the crystalline oxide 21 be:

$$0.001 \leq [M2]/[A] < 0.2$$

In this way, a more stable crystalline oxide can be obtained. Further, the electron carrier concentration can be controlled to less than $10^{18}/cm^3$.

As the positive divalent element, normally, at least one of Zn, Mg, Ni, Co and Cu is used. As for the added amount of Zn, Mg, Ni, Co and Cu relative to the total metal elements of the crystalline oxide 21 is 0.1 at % or more and less than 20 at %. The reason therefor is that, if the content is less than 0.1 at %, effects of addition are small, and there may be a case where the electron carrier concentration cannot be lowered. If the content is 20 at % or more, the crystallization temperature becomes too high to be put into practical use. It is preferred that the atomic range be $0.005 \leq [M2]/[A] < 0.1$, more preferably $0.01 \leq [M2]/[A] < 0.08$. Substantially the similar effects can be obtained if Mg is selected instead of Zn. Zn, Mg, Ni, Co and Cu exhibit almost similar effects.

In the above-mentioned description, the amount of carriers generated by oxygen deficiency is suppressed by the amount of the divalent metal element contained in the crystalline oxide 21. That is, after the film formation, it is preferable to control carriers by crystallization and the amount of oxygen deficiency (decrease or increase) by reaction with the oxygen of air, by subjecting an indium oxide film to a post treatment in an atmosphere containing oxygen to crystallize the film. In order to control the amount of oxygen deficiency effectively, the temperature of the oxygen-containing atmosphere may preferably be 150° C. or more and 500° C. or less, preferably 200° C. or more and 300° C. or less, further preferably 250° C. or more and 300° C. or less. It is also preferable to conduct crystallization and a reaction with oxygen simultaneously.

By controlling carriers and extinguishing oxygen deficiency by conducting film formation in an atmosphere containing oxygen, followed by a heat treatment for crystallization, a prescribed electron carrier concentration (less than $10^{18}/cm^3$) may be attained, and a past treatment may be conducted in an atmosphere containing oxygen after the film formation. As long as the prescribed electron carrier concentration (less than $10^{18}/cm^3$) is attained, it is better not to conduct oxygen partial pressure control and to conduct a post treatment in an atmosphere which does not contain oxygen.

The above-mentioned crystalline oxide 21 may contain a positive trivalent element other than the indium instead of the positive divalent element.

Also in this way, due to the effects of extinguishing carriers generated by oxygen deficiency, it is possible to decrease the electron carrier concentration. Further, although being inferior to that of a single crystal, the electron mobility of a thin film formed of the crystalline oxide 21 can be high. In addition, by containing a positive trivalent element, a thin film formed of the crystalline oxide 21 is more stabilized. The film has a high field effect mobility, and the composition range for a stable crystalline oxide can be expanded.

A configuration is not limited to one in which either one of the above-mentioned positive divalent element and the above-mentioned positive trivalent element is contained. However, it may be a configuration in which the above-mentioned positive divalent element and the above-mentioned positive trivalent element are contained. In this way, generation of carriers can be suppressed further effectively.

In the In-containing crystalline oxide 21, oxygen and metal ions are subjected to ionic bonding. Therefore, a divalent or trivalent metal oxide cannot be an ionic carrier scattering factor. That is, the electron mobility of the crystalline oxide 21 containing at least one element of Zn, Mg, Ni, Co and Cu, or at least one element of B, Al, Ga, Sc, Y and a lanthanoid element; or at least one element of Zn, Mg, Ni, Co and Cu, and at least one element of B, Al, Ga, Sc, Y and a lanthanoid element is, although being inferior to that of a single crystal, almost equivalent to that of a single crystal.

Further, it is preferred that the above-mentioned positive trivalent element be at least one element of B, Al, Ga, Sc, Y and a lanthanoid element.

In this way, the crystalline oxide can be effectively stabilized due to strong ion bonding property of B, Al, Ga, Sc, Y and a lanthanoid element. In the case of a composite indium oxide consisting of ions with a small difference in ionic radius, the crystalline phase can be more stabilized. For example, in the case of the In-lanthanoid element-oxygen-based crystalline oxide 21, the ionic radius decreases and gets closer to the ionic radius of indium with an increase in the atomic number of a lanthanoid element. In this way, in the case of an ion with a small atomic number, it is difficult to obtain a crystalline indium oxide film which is stable even though it is subjected to a heat treatment. However, by adding In and a lathanoid element in an amount ratio of 0.5 at % to 10 at % relative to the total metal elements, a stable crystalline film can be obtained easily. On the other hand, in the case of an ion with a large atomic number, it is easy to obtain a crystalline indium oxide film which is stable even though it is subjected to a heat treatment. By adding In and a lanthanoid element in an amount ratio of 0.5 at % to 10 at % relative to the total metal elements, a significantly stable crystalline film can be obtained.

In addition, B, Al, Ga, Sc, Y and a lanthanoid element has a strong bonding power with oxygen (the work function of a metal is smaller than the work function of an In metal), and an oxygen deficiency does not occur easily. Further, by adding at least one element of Zn, Mg, Ni, Co and Cu to form a composite indium oxide, carriers generated by partial oxygen deficiency can be controlled and carriers are not generated easily.

It is preferred that the atomic ratio of the number of atoms of the positive trivalent element ([M3]) to the number of atoms of the total metal element ([A]) contained in the crystalline oxide 21 be:

$$0.001 \le [M3]/[A] < 0.2$$

In this way, a more stable crystalline oxide can be obtained. In addition, the electron carrier concentration can be controlled to less than $10^{18}/cm^3$.

As the positive trivalent element, at least one element of B, Al, Ga, Sc, Y and a lanthanoid element is normally used.

As for the added amount of B, Al, Ga, Sc, Y and a lanthanoid element relative to the total metal elements in the crystalline oxide 21 is 0.1 at % or more and less than 20 at %. The reason therefor is that, if the added amount is less than 0.1 at %, effects of addition is small, and the electron carrier concentration may not be decreased. If the added amount is 20 at % or more, the crystallization temperature becomes too high to be put into practice. Preferably, the atomic ratio is $0.005 \le [M3]/[A] < 0.1$, more preferably $0.01 \le [M3]/[A] < 0.08$. For example, if Y is selected instead of B, almost similar effects can be obtained. B, Al, Ga, Sc, Y and a lanthanoid element exhibits almost similar effects.

The crystalline oxide 21 containing the positive divalent element or the positive trivalent element can be formed into a film by a sputtering method, for example.

Then, Film-formation Example 1 of a thin film of the crystalline oxide 21 is explained.

FILM-FORMATION EXAMPLE 1

Using as a target a polycrystalline sintered body having an indium oxide composition containing at least one of Zn, Mg, Ni, Co and Cu; or a transparent indium oxide composition containing B, Al, Ga, Sc, Y and a lanthanoid element, the above-mentioned crystalline oxide 21 can be formed by a sputtering method. Generally, as the method of forming a crystalline indium oxide film, a vapor phase method such as a pulse laser deposition method (PLD method), the sputtering method (SP method), the electron beam deposition method or the like are used. In the PLD method, it is easy to control the composition of materials, and the SP method is excellent in respect of mass productivity. The film-formation method is, however, not particularly limited.

In the above-mentioned polycrystalline target, it is possible to use a sintered body target having an indium oxide composition containing at least one of Zn, Mg, Ni, Co and Cu; or an indium oxide composition containing B, Al, Ga, Sc, Y and a lanthanoid element (size: 4 inches in diameter, 5 mm in thickness). This can be produced by subjecting, as starting materials, $In_2O_3$ and at least one of Zn, Mg, Ni, Co and Cu or at least one of B, Al, Ga, Sc, Y and a lanthanoid element (4N reagent, each) to wet mixing (solvent: ethanol), granulating, single-axial press molding or a cold static press molding, and sintering (at 1450° C. for 36 hours).

As for the $In_2O_3$ targets produced by the above-mentioned method, the specific resistance of an $In_2O_3$ target in which 5 wt % of Zn was added in terms of ZnO, the specific resistance of an $In_2O_3$ target in which 3 wt % of Mg was added in terms of MgO, the specific resistance of an $In_2O_3$ target in which 2 wt % of Ni was added in terms of NiO, the specific resistance of an $In_2O_3$ target in which 2 wt % of Co was added in terms of CoO, the specific resistance of an $In_2O_3$ target in which 1 wt % of Cu was added in terms of CuO, the specific resistance of an $In_2O_3$ target in which 2 wt % of B was added in terms of $B_2O_3$, the specific resistance of an $In_2O_3$ target in which 2 wt % of Al was added in terms of $Al_2O_3$, the specific resistance of an $In_2O_3$ target in which 4 wt % of Ga was added in terms of $Ga_2O_3$, the specific resistance of an $In_2O_3$ target in which 3 wt % of Sc was added in terms of $Sc_2O_3$, the specific resistance of an $In_2O_3$ target in which 3 wt % of Y was added in terms of $Y_2O_3$, the specific resistance of an $In_2O_3$ target in which 1 wt % of a trivalent lanthanoid element was added in terms of a trivalent lanthanoid element oxide was almost 0.005 (Ωcm).

The ultimate vacuum of a film-forming room was allowed to be $5 \times 10^{-6}$ Pa, and an argon gas (containing 3% of oxygen) was controlled to 0.3 Pa. By allowing the substrate temperature to be room temperature, film formation was conducted by a sputtering method using the above-mentioned targets. As a result, an indium oxide thin film with a thickness of 100 nm was obtained within about 40 minutes. It is preferred that the sputtering pressure be controlled to about 0.1 Pa or more and less than 2.0 Pa.

For the thus obtained thin film, grazing incidence X-ray diffraction (the thin film method, incidence angle: 0.5 degree) of the thin film was performed. No clear diffraction peak was observed. From this fact, it was confirmed that each of the produced indium oxide thin films was amorphous. After heating these thin films at 200° C. or higher in air for one hour, grazing incidence X-ray diffraction (the thin film method, incidence angle: 0.5 degree) of the thin film was performed. In each thin film, a clear diffraction peak was observed. From this fact, it was confirmed that each of the produced indium oxide films was crystallized. As a result, a thin film formed of the crystalline oxide 21 was obtained.

Further, as a result of an X-ray reflectance measurement to analyze the pattern, the average root mean square resistance (Rrms) of each of the thin films was about 0.8 nm. The specific resistance of each of the thin films was about $10^2$ Ωcm or more. From this, it was assumed that the electron carrier concentration was about $10^{16}$/cm$^3$ and the electron mobility was about 7 cm$^2$/(V·sec).

The electron carrier concentration was measured by means of a Hall measurement apparatus manufactured by Toyo Corporation.

From the analysis of a light absorption spectrum, the forbidden band energy width of the thus obtained amorphous thin film was found to be about 3.2 eV. Further, as a result of a measurement by means of a spectrophotometer, this semiconductor thin film had a transmittance to light having a wavelength of about 400 nm of about 85%, which means that the semiconductor thin film was excellent also in transparency.

From the above, the produced crystalline oxide 21 was a low electroconductive, transparent, and flat thin film which suffered only a slight degree of oxygen deficiency.

The crystalline oxide 21 in the above-mentioned Film-formation Example 1 was formed into a film at low temperatures, and an oxide formed into a film at these temperatures is amorphous. Therefore, the crystalline oxide 21 can be prepared by crystallizing by heating an oxide which has been formed into a film in an amorphous state.

Then, the measurement results of the crystallization temperature and the electron carrier concentration of the crystalline oxide 21 will be explained with reference to the drawings.

[Measurement Results of the Crystallization Temperature and the Electron Carrier Concentration of the Crystalline Oxide]

Figure 2:
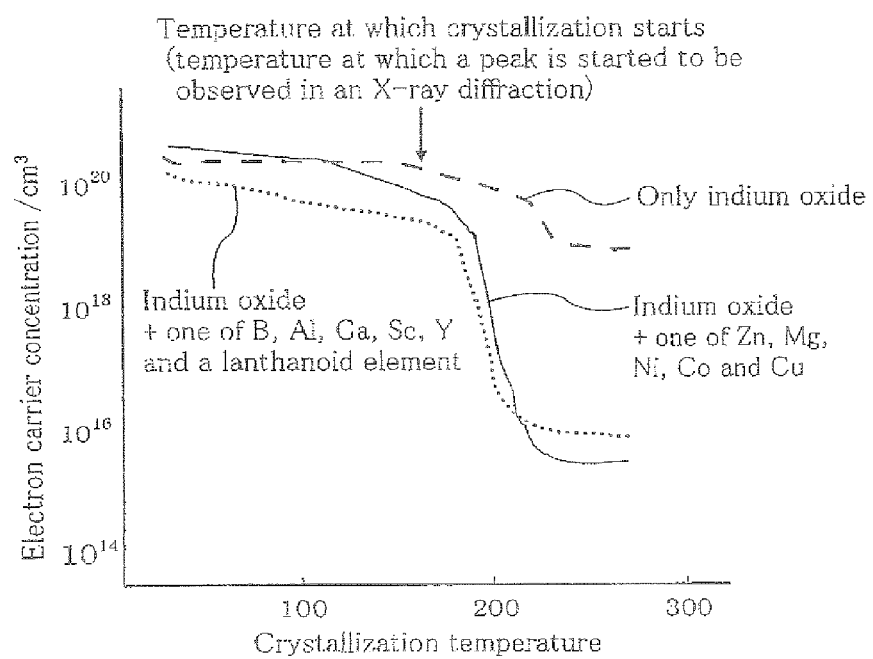
FIG. 2 is a graph showing the crystallization temperature and the electron carrier concentration of a crystalline oxide according to Film-forming Example 1.

FIG. 2 is a graph showing the crystallization temperature and the electron carrier concentration of a crystalline oxide according to the Film-forming Example 1.

In FIG. 2, a thin line indicates the crystalline oxide 21 in which to indium oxide are added a positive divalent element (Zn, Mg, Ni, Co and Cu, with Zn being as a representative example) (appropriately abbreviated as a crystalline oxide indicated by a thin line). For the crystalline oxide indicated by the thin line, a sputtering target containing about 5 wt % of zinc oxide, with the remaining being indium oxide was used. In air, a heat treatment was conducted at each temperature for one hour to measure the carrier concentration by a Hall measurement. At the same time, using the same sample, crystalline properties were confirmed by an X-ray diffraction method.

The dotted line indicates the crystalline oxide 21 in which to indium oxide are added a positive trivalent element (B, Al, Ga, Sc, Y, La, Nd, Sm, Eu, Gd, Dy, Ho, Er, Tm, Yb and Lu, with Yb being as a representative example) (appropriately abbreviated as a crystalline oxide indicated by a dotted line) other than the above-mentioned indium. For the crystalline oxide indicated by the dotted line, a sputtering target containing about 1 wt % of ytterbium oxide, with the remaining being indium oxide was used. In air, a heat treatment was conducted at each temperature for one hour to measure the carrier concentration by a Hall measurement. At the same time, using the same sample, crystalline properties were confirmed by an X-ray diffraction method.

Further, a thick broken line indicates a crystalline oxide composed only of indium oxide (appropriately, abbreviated as a crystalline oxide indicated by the broken line).

The crystalline oxides indicated by a thin line, the crystalline oxide indicated by a dotted line and the crystalline oxide indicated by a broken line were produced in substantially the same manner as in the above-mentioned Film-forming Example 1, except for the crystallization temperature or the like. The electron carrier concentration relative to the crystallization temperature was measured.

As for the crystalline oxide indicated by a thin line, the electron carrier concentration suddenly lowered at a crystallization temperature of about 200° C., and such a lowering stopped at about 230° C. If crystallized at about 250° C., the electron carrier concentration was about $5 \times 10^{15}$/cm$^3$. As a result of observation by means of an X-ray diffraction, the oxide which was subjected to a heating treatment at a temperature of 180° C. or higher, a clear peak was observed, and hence, it was confirmed that this oxide was of a bixbyite structure. Further, similar results were obtained when similar observations were conducted by adding about 5 at % of Mg, Ni, Co or Cu instead of Zn.

As for the crystalline oxide indicated by a dotted line, the electron carrier concentration suddenly lowered from the crystallization temperature of about 200° C., and such a lowering stopped at about 230° C. When crystallized at about 250° C., the electron carrier concentration was about $10^{16}$/cm$^3$. As a result of observation by means of an X-ray diffraction, the oxide which was subjected to a heating treatment at a temperature of 180° C. or higher, a clear peak was observed, and hence, it was confirmed that this oxide was of a bixbyite structure. Further, similar results were obtained when similar observations were conducted by adding about 4 at % of B, Al, Ga, Sc, Y, La, Nd, Sm, Eu, Gd, Dy, Ho, Er, Tm or Lu instead of Yb.

As for the crystalline oxide indicated by a broken line, the electron concentration suddenly lowered from the crystallization temperature of about 220° C., and such a lowering stopped at about 240° C. If crystallized at about 250° C., the electron carrier concentration was about $10^{19}$/cm$^3$.

That is, the crystalline oxide indicated by the dotted line and the crystalline oxide indicated by the thin line could have an electron carrier concentration which is preferable as a semiconductor (less than about $10^{18}$/cm$^3$) by controlling their crystallization temperatures.

The crystalline oxide indicated by a broken line started to crystallize at about 160° C. That is, by heating to about 160° C., a peak was observed in an X-ray diffraction, which means the start of crystallization. In the case of the crystalline oxide indicated by the thin line and the crystalline oxide indicated by the dotted line, the added amount may be set to be smaller when the crystallization temperature is set to be a low temperature. When the crystalline temperature can be set to be a high temperature, the added amount may be set to be larger.

The Hall measurement apparatus and the Hall measurement conditions for determining an electron carrier concentration are as follows.

[Hall Measurement Apparatus]

Resi Test 8310: manufactured by Toyo Corporation

[Measurement Conditions]

Room temperature (about 25° C.), about 0.5 [T], about $10^{-4}$ to $10^{-12}$ A, AC magnetic field Hall measurement From the above-mentioned measurement results, in order to control the electron carrier concentration effectively, the heat treatment is preferably conducted at the temperature in an atmosphere containing oxygen of 150° C. or more and 500° C. or less, preferably 200° C. or more and 300° C. or less, and further preferably 250° C. or more and 300° C. or less.

By conducting the crystallization treatment in an atmosphere which contains oxygen in a prescribed concentration, crystallization can be controlled effectively.

Further, although not shown, by further increasing the added amount of the positive divalent element or the positive trivalent element, and by forming into a film at high temperatures to allow crystallization to be conducted easily, and by conducting a heat treatment at high temperatures, the electron carrier concentration could be further decreased.

The lower limit of the electron carrier concentration in the invention varies depending on the application of the resulting indium oxide film, i.e. the device, circuit or apparatus in which the resulting indium oxide film is used.

However, the lower limit is $10^{14}$/cm$^3$, for example.

In this embodiment, at first, an amorphous oxide is formed at low temperatures, and then, heated to a crystallization temperature, thereby to obtain the crystalline oxide 21 with a desired carrier concentration. The manner is, however, not limited to this. For example, the crystalline oxide 21 may be formed during film formation at high temperatures.

The film formation may be conducted in an atmosphere containing oxygen, and the crystallization may be also conducted in an atmosphere containing oxygen. As long as a prescribed electron carrier concentration (less than $10^{18}$/cm$^3$) can be obtained, no control on the oxygen partial pressure may be made during film formation and a crystallization treatment after the film formation may be conducted in an atmosphere containing oxygen.

[Measurement Results on the Electron Carrier Concentration and the Electron Mobility of the Crystalline Oxide]

Then, the measurement results on the electron carrier concentration and the electron mobility of the resulting crystalline oxide 21 will be explained with reference to the drawings.

Figure 3:
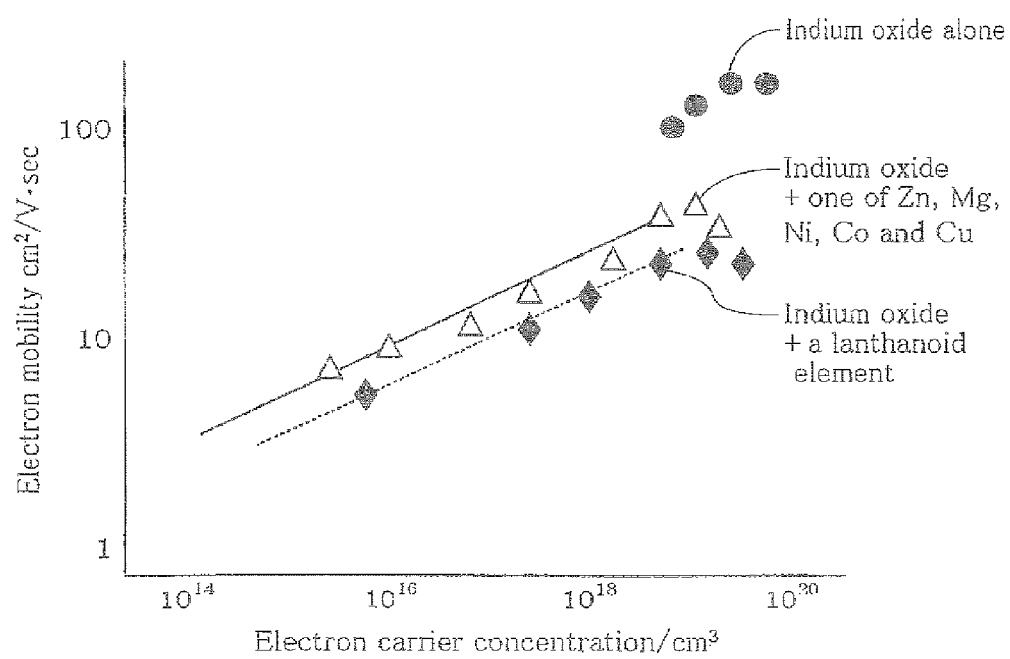
FIG. 3 is a graph showing the electron carrier concentration and the electron mobility of a crystalline oxide according to Film-forming Example 1.

FIG. 3 is a graph showing the electron carrier concentration and the electron mobility of a crystalline oxide according to Film-forming Example 1.

In FIG. 3, the triangle indicates the crystalline oxide 21 in which a positive divalent element (for example, Zn in an amount of 5 wt % as converted in ZnO) is added in indium oxide (appropriately abbreviated as the crystalline oxide indicated by the triangle).

The diamond indicates the crystalline oxide 21 in which a lanthanoid element (for example, Yb in an amount of 1 wt % as converted in Yb$_2$O$_3$) is added in indium oxide (appropriately abbreviated as the crystalline oxide indicated by the diamond).

The circle indicates the crystalline oxide 21 composed only of indium oxide (appropriately abbreviated as the crystalline oxide indicated by the circle).

The crystalline oxide indicated by the diamond and the crystalline oxide indicated by the triangle were prepared by controlling the crystallization temperature, the content of a lanthanoid element or a positive divalent element or the like. Whether an electron carrier concentration of less than $10^{18}$/cm$^3$ can be attained or not depends on the conditions of a heat treatment, the configuration of a film-forming apparatus, materials to be formed into a film, composition or the like.

The crystalline oxide indicated by the triangle and the crystalline oxide indicated by the diamond had an electron carrier concentration of about $10^{16}$/cm$^3$ to about $10^{19}$/cm$^3$, and an electron mobility of about several cm$^2$/V·sec to several tens cm$^2$/V·sec by controlling production conditions (the crystallization temperature, the content or the like).

The crystalline oxide indicated by the circle had an electron carrier concentration of about $10^{19}$/cm$^3$ to about $10^{20}$/cm$^3$ and an electron mobility of about 100 cm$^2$/V·sec although controlling production conditions. Further, the above-mentioned crystalline oxide indicated by the triangle and the above-mentioned crystalline oxide indicated by the diamond are merely one example. Although not shown, the crystalline oxide 21 having more improved properties could be prepared by controlling production conditions.

Normal compounds show a tendency that the electron mobility decreases due to the collision of electrons with an increase in the number of electrons. In contrast, in the case of the crystalline oxide indicated by the diamond and the crystalline oxide indicated by the triangle, the electron mobility logarithmically proportionally increases with increased electron carrier concentration in an electron carrier concentration range of about $1\times10^{16}$ to $1\times10^{18}$/cm$^3$. That is, if the electron carrier concentration (X coordinate) and the electron mobility (Y coordinate) are plotted in the graph of the both logarithms, the plotted points were almost on a straight line rising from the left to the right. In addition, depending on the combination of a positive divalent element or a positive trivalent element to be contained in the crystalline oxide 21, the plotted points form almost straight different lines rising from the left to the right.

By effectively utilizing these unique properties, the electron carrier concentration or the electron mobility can be freely set to a desired value. As a result, it is possible to provide the crystalline oxide 21 which has more preferable semiconductor properties for various semiconductor devices. In addition, the added value of the semiconductor device can be improved.

In this embodiment, the electron mobility of the crystalline oxide 21 which is used as the channel layer of the field-effect thin film transistor 1 can exceed 1 cm$^2$/(V·sec) or more, preferably exceed 5 cm$^2$/(V·sec). As a result, the saturation current after pinch-off can be allowed to exceed about 10 µA and an on-off ratio can be allowed to exceed about $10^3$. Further, the electron carrier concentration can be allowed to be less than $10^{18}$/cm$^3$, preferably less than $10^{16}$/cm$^3$. The current flown between the source electrode 22 and the drain electrode 23 when the transistor is off (no gate voltage is applied) can be less than about 10 µA, preferably less than about 0.1 µA.

Further, as for the field-effect thin film transistor 1, a high voltage is applied to the gate electrode 25 in the pinch-off state, and high-density electrons are present in the crystalline oxide 21 as the channel layer. Therefore, according to the invention, the saturation current value can be increased in an amount corresponding to the increase in the electron mobility. As a result, almost all transistor properties are improved, i.e. an on-off ratio is increased, the saturation current is increased, the switching speed is increased, or the like.

The indium oxide (In$_2$O$_3$) film can be formed by the vapor phase method, and an amorphous film can be obtained by adding about 0.1 Pa of moisture content in an atmosphere during film formation. This amorphous indium oxide film can be crystalline indium oxide by a heat treatment. However, in the case of an In$_2$O$_3$ film alone, although a crystalline film can be obtained, stable semiconductor properties cannot be exhibited even when about 30% of oxygen gas is introduced into an atmosphere during film formation.

FILM-FORMING EXAMPLE 2

In this film-forming example, the crystalline oxide 21 was formed into a film by a direct current (DC) sputtering method using an argon gas as an atmospheric gas. The sputtering method is not limited to a direct current (DC) sputtering method. For example, film formation can be conducted by a RF (radio frequency) sputtering method.

Figure 4:
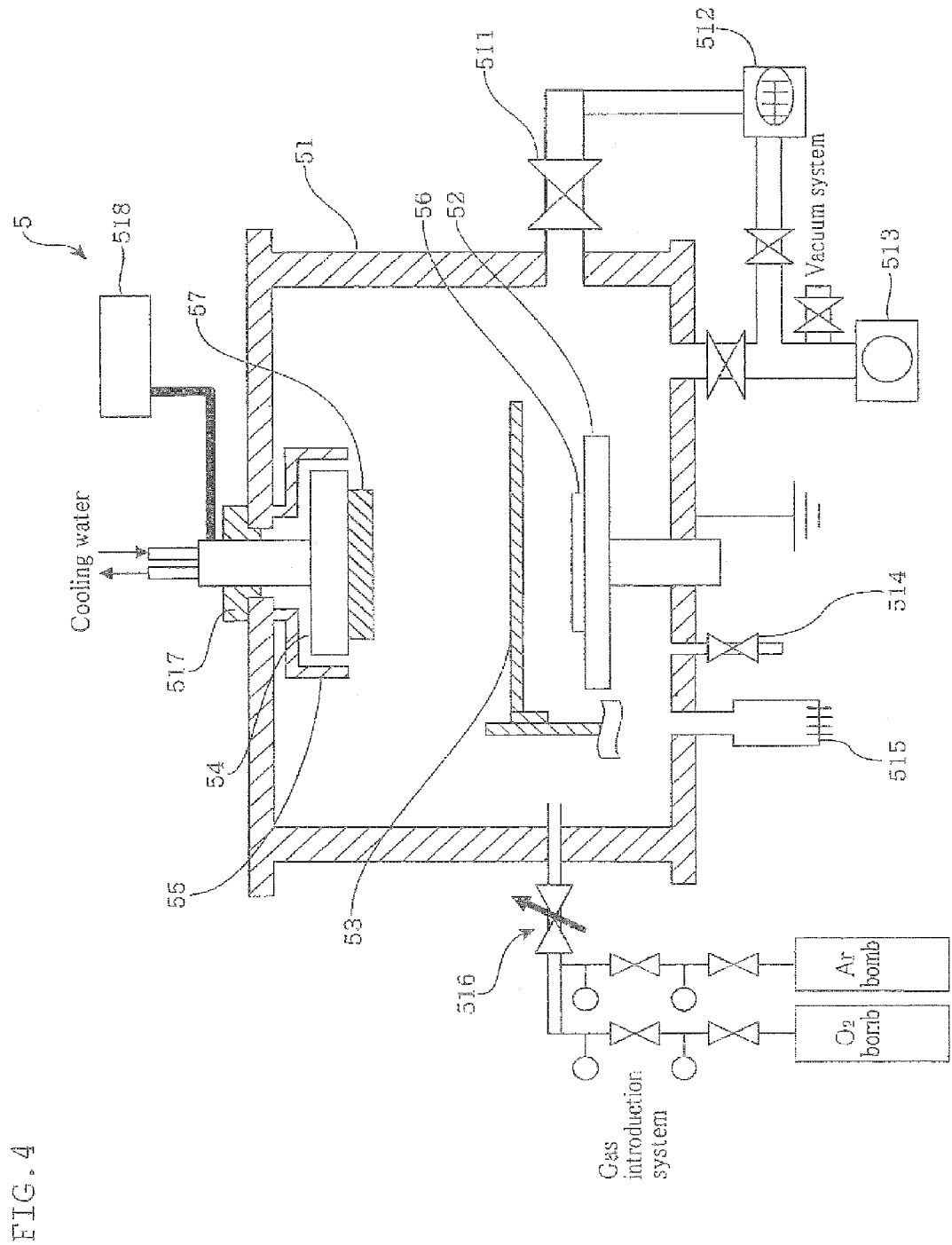
FIG. 4 is a schematic view of a sputtering apparatus which was used for preparing a crystalline oxide according to Film-forming Example 2.

FIG. 4 is a schematic view of a sputtering apparatus which was used for preparing a crystalline oxide according to Film-forming Example 2.

In FIG. 4, in a sputtering apparatus 5, within a film-forming chamber 51, a substrate holder 52 provided with cooling and heating mechanisms, a shutter 53, an electrode 54 and a shield 55 are provided. In addition, a main valve 511, a turbomolecular pump 512, an oil-rotating pump 513, a leak valve 514, a vacuum meter 515 or the like are provided in order to allow the inside of the film-forming chamber to be vacuum. In the film-forming chamber 51, an oxygen gas or an Ar gas is supplied through a barrier leak valve 516. In addition, the electrode 54 is installed in the film-forming chamber 51 through an insulator 517, and electric power is supplied from a DC power source 518, followed by cooling with cooling water. In addition, a substrate 56 is installed on the substrate holder 52, and a target 57 is put on the electrode 54.

As the substrate 56 for film formation, an SiO$_2$ glass substrate (1737 manufactured by Corning) was prepared. As the treatment before the film formation, this substrate 56 was subjected to ultrasonic degreasing cleaning for 5 minutes each with acetone, ethanol and ultrapure water, and dried at 100° C. in air. The substrate is preferably subjected to UV ozone cleaning, whereby a film with good adhesion can be obtained.

As a target material, an indium oxide polycrystalline sintered body containing In$_2$O$_3$(ZnO)$_4$ composition (size: 4 inches in diameter, 5 mm in thickness) was used.

In this sintered body, as a starting material, 99 wt % In$_2$O$_3$:1 wt % ZnO (4N reagent each) was subjected to wet mixing (solvent: ethanol), granulated by means of a spray drier, and molded using a single-axis pressing machine. Further, cold isostatic pressing was conducted, following by main sintering (36 hours at 1450° C.). The thus prepared target had a specific resistance of 0.005 (Ωcm).

The ultimate pressure in the film-forming chamber 51 was 5×10$^{-4}$ Pa. The total pressure of the oxygen gas and the argon gas during film formation was fixed within a range of 0.1 to 2.0 Pa. The partial pressure ratio of an argon gas and an oxygen gas was changed to allow it to vary within an oxygen concentration of 1 to 30%.

The substrate temperature was room temperature, and the distance between the target and the substrate for film formation was 80 mm. The substrate holder 52 was provided with a rotating mechanism, whereby a uniform thin film could be obtained by conducting film formation while rotating.

The input powder was DC 100 W and the film-forming speed was 5 nm/mm.

For the thus obtained thin film, grazing incidence X-ray diffraction (the thin film method, incidence angle: 0.5 degree) of the thin film was performed. No clear diffraction peak was observed. From this fact, it was confirmed that each of the indium oxide thin films immediately after produced was amorphous. After heating these thin films at 200° C. or higher, grazing incidence X-ray diffraction (the thin film method, incidence angle: 0.5 degree) of the thin film was performed. In each thin film, a clear diffraction peak was observed, showing that this thin film was crystalline. The carrier concentration of this crystalline thin film was 0.8×10$^{16}$/cm$^3$, showing that this was less than 10$^{16}$/cm$^3$.

Further, as a result of an X-ray reflectance measurement to analyze the pattern, the average root mean square resistance (Rrms) of each of the thin films was about 0.8 nm. As a result of an analysis by the ICP method, the atomic ratio of the number of the atoms of Zn (=[Zn]) to the number of the atoms of total metal elements contained in the crystalline oxide ([A]) was [Zn]/[A]=0.018. In this film-formation Example, it was found that [A]=[In]+[Zn]. [In] is the number of the atoms of In contained in the crystalline oxide.

[Measurement Results of the Ratio of Added Metals and the Electric Resistivity in the Crystalline Oxide]

Then, by varying the type, the composition or the like of the positive divalent element and the positive trivalent element to be added, and by further controlling the preparation conditions, a plurality of crystalline oxides 21 were prepared.

Next, the measurement results of the ratio of added metals and the electric resistivity (specific resistance) in parts of these crystalline oxides 21 will be explained with reference to the drawings.

Figure 5:
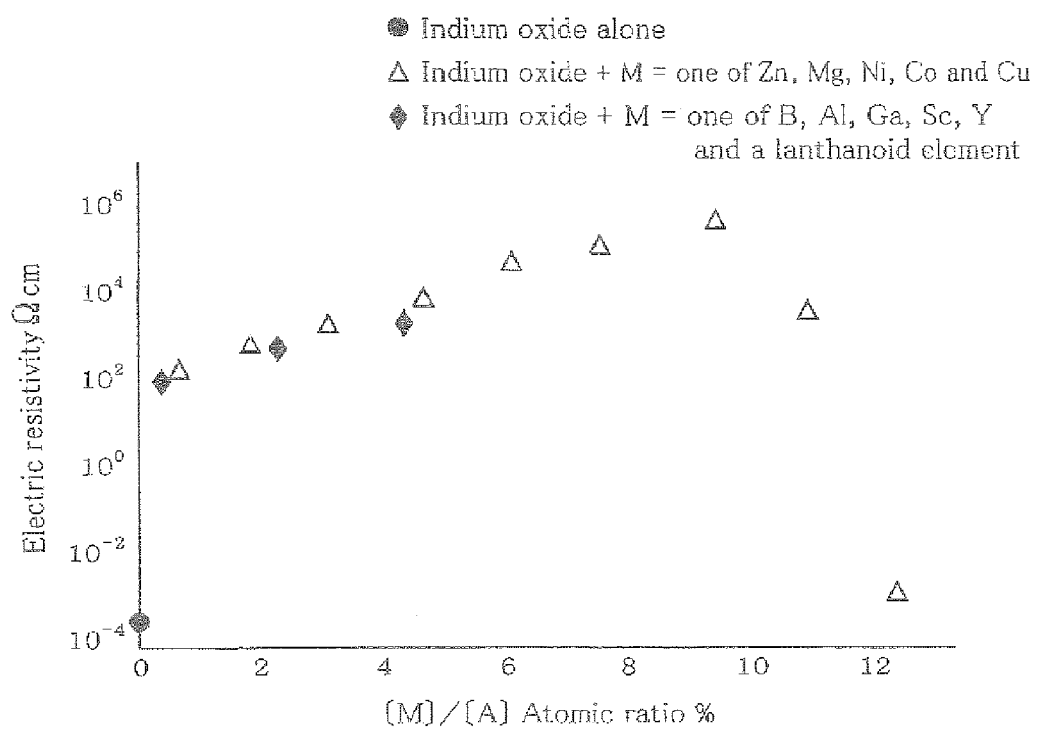
FIG. 5 is a graph showing the atomic ratio and the electric resistivity of added metals in the crystalline oxide in Film-forming Example 2.

FIG. 5 is a graph showing the atomic ratio of the added metals and the electric resistivity in the crystalline oxide according to the Film-forming Example 2.

In FIG. 5, the triangle indicates the crystalline oxide 21 (appropriately abbreviated as the crystalline oxide indicated by the triangle) in which a positive divalent element (M=at least one of Zn, Mg, Ni, Co and Cu. In FIG. 5, 5 wt % of Zn as converted to ZnO) is added in indium oxide.

The diamond indicates the crystalline oxide 21 (appropriately abbreviated as the crystalline oxide indicated by the diamond) in which a positive trivalent metal other than the indium (M=at least one of B, Al, Ga, Sc, Y, La, Nd, Sm, Eu, Gd, Dy, Ho, Er, Tm, Yb and Lu. In FIG. 5, 1 wt % of Yb as converted to Yb$_2$O$_3$) is contained.

Further, the circle indicates the crystalline oxide composed only of indium oxide (appropriately abbreviated as the crystalline oxide indicated by the circle).

In the above-mentioned crystalline oxide indicated by the triangle, when the atomic ratio of the number of the atoms of the positive divalent element ([M]) to the number of the atoms of total metal elements contained the crystalline oxide 21 ([A]) [M]/[A] is about 0.6% to 12.3%, the electric resistivity was about $2 \times 10^{-2}$ Ωcm to $10^5$ Ωcm. That is, by adding a slight amount of an added metal M which is a positive divalent element, the electric resistivity could be improved to about $10^2$ Ωcm or more. By further increasing the atomic percentage, crystallization stops to increase the electric resistance. For example, in the case of an indium oxide thin film containing 9.5 at % of zinc formed at a substrate temperature of 25° C. and an oxygen partial pressure of 3%, the electric resistance could be improved to about $10^5$ Ωcm. Further, in the case of the crystalline indium oxide film containing 10 at % or more of zinc, the electric resistance was lowered to become a conductive thin film. This conductive thin film was heat treated at 300° C. After performing grazing incidence X-ray diffraction (the thin film method, incidence angle: 0.5 degree) of the thin film, no clear diffraction peak was observed, showing that the indium oxide thin film was amorphous.

In the case of the above-mentioned crystalline oxide indicated by the diamond, when the atomic ratio % of the number of the atoms of the positive trivalent element ([M]) to the number of the atoms of total metal elements contained M the crystalline oxide 21 ([A]) (=[M]/[A]) is about 0.3 to 4.2%, the electric resistivity was about $10^2$ Ωcm to $10^3$ Ωcm.

The crystalline oxide indicated by the circle had an electric resistivity of about $10^{-3}$ Ωcm.

From the above-mentioned measurement results, as for the crystalline oxide 21, the added amount of zinc may exceed about 0.1 at %, preferably about 0.5 at %, and the added amount of zinc may be about 12 at % or less, preferably about 10 at % or less. The crystalline oxide 21 may be a transparent crystalline indium oxide thin film which has a bixbyite structure of indium oxide in the crystalline structure in the crystalline state. By using this transparent crystalline indium oxide thin film in the field-effect thin film transistor 1, a normally-off transistor with an on-off ratio exceeding $10^3$ could be constituted.

In addition, by further increasing the crystallization temperature, it is possible to increase the amount of zinc oxide to be added. However, it is not industrially preferable in respect of energy required for a treatment at high temperatures.

When the sputtering apparatus 5 or the materials used in this film-forming example are used, the crystallization treatment conditions after film formation by sputtering may be 200° C. or higher and 300° C. or lower in the air, for example. Although not shown, in the crystalline oxide 21 in this film-forming example, the electron mobility logarithmically proportionally increased with an increase in electron carrier concentration. Further, it is preferable to conduct film formation in an atmosphere containing an oxygen gas while intentionally omitting addition of impurities ions for increasing an electric resistivity.

It is preferred that the crystalline oxide 21 of this embodiment have PAN resistance. In this way, the freedom of production process is enhanced, whereby TFT1 can be produced efficiently. In addition, reliability or the like is improved since no damage is exerted when the source electrode 22 and the drain electrode 23 are etched with a PAN-based etching solution. In the crystalline oxide 21 of this embodiment is subjected to patterning in an amorphous state, followed by crystallization. Since the crystalline oxide 21 which has been crystallized normally has PAN resistance, the source electrode 22 and the drain electrode 23 can be subjected to patterning easily.

Here, the "having PAN resistance" means having an etching speed with a PAN-based etching solution of less than about 10 nm/min. Generally, as the PAN-based etching solution (an etching solution containing phosphoric acid, nitric acid and acetic acid), one which contains phosphoric acid of about 45 to 95 wt %, nitric acid of about 0.5 to 5 wt % and acetic acid of about 3 to 50 wt % is used.

Further, it is preferred that the concentration of Li and Na in the crystalline oxide 21 be 1,000 ppm or less. In this way, the properties do not vary largely when driven for a long period of time, whereby reliability of the TFT1 can be improved. The concentration of Li and Na is preferably 100 ppm or less, further preferably 10 ppm or less, with 1 ppm or less being particularly preferable.

PREPARATION EXAMPLE 1 OF A FIELD-EFFECT THIN FILM TRANSISTOR

Next, the preparation example of a field-effect thin film transistor 1 using the above-mentioned crystalline oxide 21 will be explained with reference to the drawings.

Figure 6:
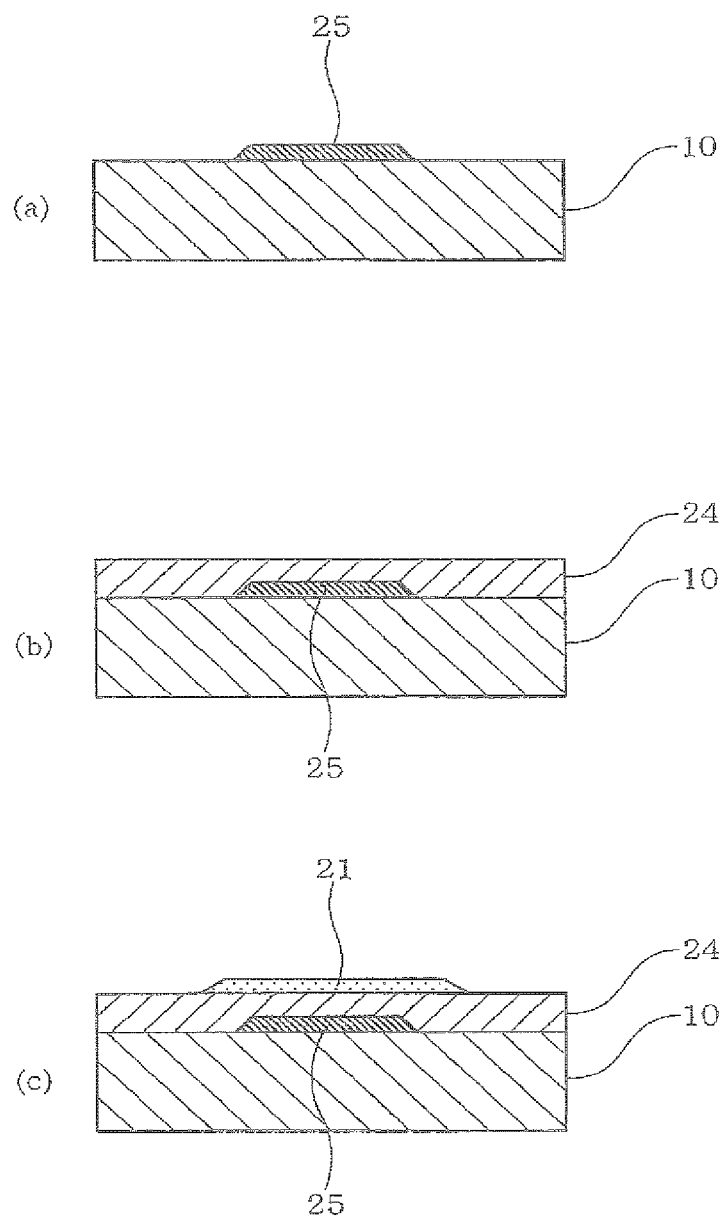
FIG. 6 is a schematic view of essential parts for explaining the method for producing a field-effect thin film transistor which is a semiconductor device according to one embodiment in the second aspect of the invention, in which (a) is a cross-sectional view showing the state in which a gate electrode is formed, (b) is a cross-sectional view showing the state in which a gate-insulating film is formed, and (c) is a cross-sectional view showing the state in which a crystalline oxide is formed.

FIG. 6 is a schematic view of essential parts for explaining the method for producing a field-effect thin film transistor which is a semiconductor device according to one embodiment in the second aspect of the invention, in which (a) is a cross-sectional view showing the state in which a gate electrode is formed, (b) is a cross-sectional view showing the state in which a gate-insulating film is formed, and (c) is a cross-sectional view showing the state in which a crystalline oxide is formed.

As shown in FIG. 6(a), on a glass substrate 10, indium oxide containing tin oxide (10 wt %) (ITO) was formed into a film by a sputtering method with a substrate temperature being at 200° C. Subsequently, a photoresist was applied, and patterns of a gate electrode 25 and a wire (not shown) were exposed to light by using a photomask, followed by development with a developer. Subsequently, the gate electrode 25 and the wiring pattern were formed by etching using a PAN-based etching solution of 35° C. (91.4 wt % of phosphoric acid, 3.3 wt % of nitric acid and 5.3 wt % of acetic acid).

Subsequently, as shown in FIG. 6(b), on the gate electrode 25, the wiring and the glass substrate 10, as a gate-insulating film 24, an SiNx film was formed by a sputtering method at a substrate temperature of 350° C.

When the crystalline oxide 21 is used as a channel layer, as the material of the gate-insulating film 24, any one of $Al_2O_3$, $SiO_2$ and SiNx, or a mixed compound containing at least two of these compounds can be given.

That is, if a fault exists in an interface between the gate-insulating film 24 and the channel layer (crystalline oxide 21) thin film, the electron mobility may be lowered or hysteresis may occur in transistor properties. Further, current leakage largely depends on the type of the gate-insulating film 24. Therefore, it is necessary to select a gate-insulating film which is suited to the channel layer. If the $Al_2O_3$ film is used, it is possible to decrease current leakage. IF the $SiO_2$ film is used, hysteresis can be small. Further, if an SiNx with a high dielectric constant is used, the electron mobility can be large. Further, by stacking these films, it is possible to obtain a TFT suffering from a small degree of current leakage and hysteresis and having a high degree of electron mobility. In addition, since the gate-insulating film formation process and the channel layer formation process can be conducted at room temperature, as the TFT structure, both a bottom-gate type TFT and a top-gate type TFT can be formed.

Next, above the gate electrode 25 and on the gate-insulating film 24, an amorphous indium oxide thin film containing 5 at % of zinc was formed by a sputtering method with the substrate being at room temperature and at a sputtering pressure of 0.3 Pa. As a result, a 50 nm-thick semi-insulating amorphous indium oxide film used as a channel layer was formed. Subsequently, the film was etched by a photolithographic method, whereby a channel layer was formed. Thereafter, the channel layer was subjected to a heat treatment in the air at 250° C. for one hour to allow it to be crystallized (see FIG. 6(c)).

The crystalline oxide 21 obtained by crystallization had an electric carrier concentration of $0.6 \times 10^{16}/cm^3$, showing that the electric carrier concentration was less than $10^{16}/cm^3$.

Then, on the crystalline oxide 21 and the gate-insulating film 24, Au was formed into a film by a mask deposition method. Subsequently, a photoresist was applied, and patterns of a source electrode 22, a drain electrode 23 and a wiring were exposed to light by using a photomask, followed by development with a developer. By etching using a PAN-based etching solution of 35° C., the source electrode 22, the drain electrode 23 and the wiring were formed (see FIG. 1).

ITO was used in the gate electrode 25 and the wiring thereof, and Au was used in the source electrode 22, the drain electrode 23 and the wiring thereof. The materials are not limited thereto. For example, ZnO, $SnO_2$, $In_2O_3$, ITO, IZO, Au, Ag, Al, Cu or the like can be used. In addition, thin films formed of different materials may be stacked.

If used in a liquid display or the like where light transmittance is required, as the source electrode 22, the drain electrode 23 and the gate electrode 25 a transparent electrode were used. As the wiring to be connected with these electrodes, a layer of a metal with a high electric conductivity such as Au can be used. In this case, normally, in the vicinity of the source electrode 22, the drain electrode 23 and the gate electrode 25, it has a structure in which a transparent electrode (or a wiring of a transparent electrode) and a metal layer are stacked.

When forming the crystalline oxide 21, a step of crystallizing by heating in the air is included. When an SiNx film or the like is formed as a passivasion film on the thus formed TFT, the above-mentioned crystallization by heating may be conducted during the step of forming the passivasion film, or may be conducted during a heating step for ensuring uniformity of a TFT device on the entire substrate surface. In such a case, it is important to set the oxygen partial pressure higher when a film is formed by sputtering. As a result, generation of carriers due to oxygen deficiency can be suppressed. As the partial oxygen pressure during film formation by sputtering, 5% or more is preferable. Although there is no upper limit, it is preferred the partial oxygen pressure be 20% or less, with 7 to 15% being more preferable.

In the film formation by the vapor phase method, by controlling the substrate temperature at the time of film formation, the crystalline oxide 21 with an electron carrier concentration of less than $10^{18}/cm^3$ can be formed at the time of film formation.

The on-off ratio of the field-effect thin film transistor 1 in this preparation example exceeded $10^3$. In addition, when a field-effect mobility was calculated from output characteristics, a field-effect mobility of about 7 $cm^2$/V·sec was obtained in the saturation region. Further, the threshold voltage (Vth) was about +0.5V, showing normally-off properties. The output characteristics showed a clear pinch-off. The thus produced field-effect thin film transistor 1 was irradiated with visible rays to conduct a similar measurement, and no change in transistor characteristics was observed. That is, according to the invention, a thin film transistor provided with a channel layer having a small electron carrier concentration and, therefore, having a high electrical resistivity and a high electron mobility can be realized.

The crystalline indium oxide thin film had excellent properties that the electron mobility increased with an increase in electron carrier concentration and exhibited degenerate conductance.

[Evaluation of Transistor Properties]

Next, the current-voltage characteristics of the field-effect transistor 1 of this preparation example 1 will be explained with reference to the drawings.

Figure 7:
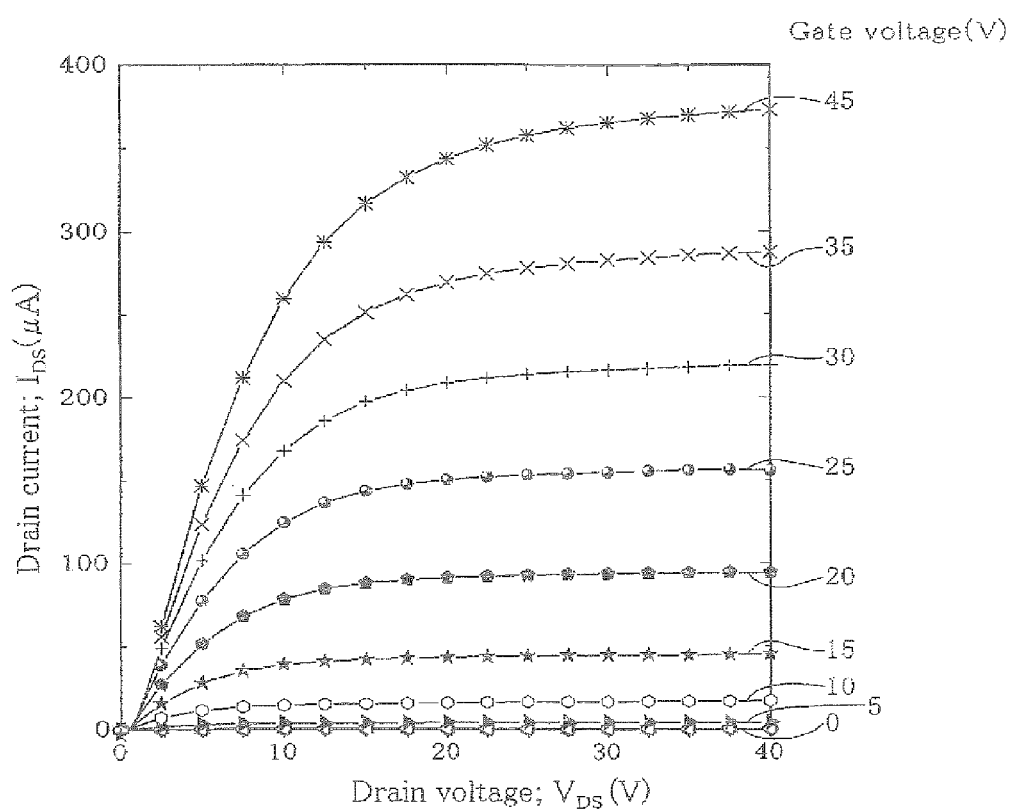
FIG. 7 is a current-voltage characteristics graph of a field-effect thin film transistor according to Preparation Example.

FIG. 7 is a current-voltage characteristics graph of a field-effect thin film transistor according to Preparation Example.

FIG. 7 shows the current-voltage characteristics of the field-effect thin film transistor 1 measured at room temperature. From the fact that the drain current $I_{DS}$ increases with an increase in the gate voltage $V_{GS}$, it can be understood that the channel is an n-type semiconductor. This does not contradict the fact that a crystalline indium oxide-based semiconductor is of n-type. In addition, $I_{DS}$ showed typical semiconductor transistor behavior that it saturated (pinch off) at around $V_{DS}=10V$. The gain properties were also examined. As a result, it was found that the threshold value of the gate voltage $V_{GS}$ at the time of $V_{DS}=4V$ was about 2.0V. When $V_{DS}=10V$, a current $I_{DS}=1.0 \times 10^{-5}$ A was flown. The reason therefor is that carriers could be induced within the crystalline indium oxide semiconductor thin film of an insulating semiconductor by gate bias.

In this preparation example, the field-effect thin film transistor 1 was formed on the glass substrate 10. Film formation itself could be conducted at room temperature, and crystallization could be conducted at lower temperatures by low-temperature plasma crystallization or the like. Therefore, a substrate such as a plate or film of plastics can be used. In addition, the crystalline indium oxide thin film obtained in this preparation example absorbs almost no visible rays, and hence, can realize a transparent, flexible TFT.

As mentioned above, in the field-effect thin film transistor 1 of this embodiment, since the above-mentioned crystalline oxide 21 is used as the channel layer, it shows the following transistor characteristics. That is, it shows normally-off characteristics with a gate current of less than 0.1 μA is flown when the transistor is in the off state and an on-off ratio exceeds $10^3$. In addition, it has transparency or light transmittance to visible rays, and also has flexibility. Further, stability, uniformity, reproducibility, heat resistance, durability or the like of the field-effect thin film transistor 1 can be improved. Further, it is possible to provide a TFT substrate with a large-area-uniformity or reproducibility.

Then, another preparation example of the field-effect thin film transistor will be explained with reference to the drawings.

PREPARATION EXAMPLE 2 OF THE FIELD-EFFECT THIN FILM TRANSISTOR

Figure 8:
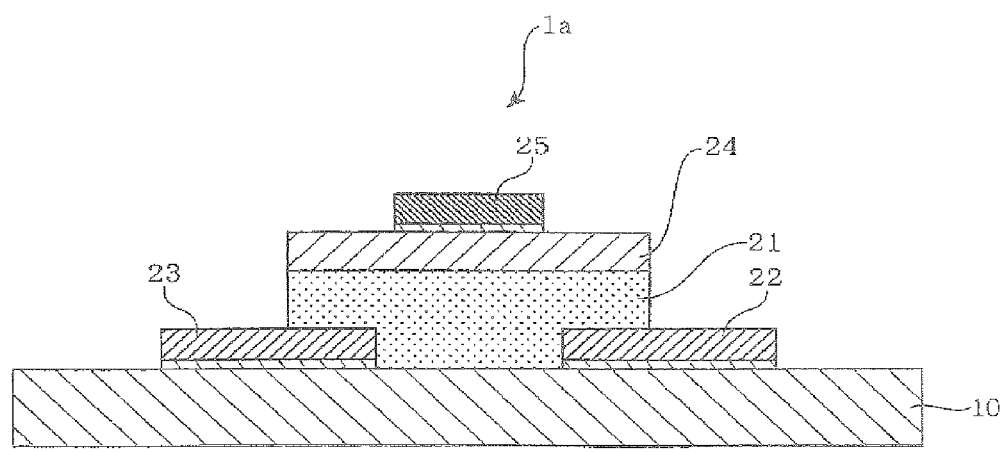
FIG. 8 is a schematic cross-sectional view of essential parts of a top-gate type field-effect thin film transistor which is a semiconductor device according to one embodiment in the second aspect of the invention.

FIG. 8 is a schematic cross-sectional view of a top-gate type field-effect thin film transistor which is a semiconductor device according to one embodiment in the second aspect of the invention.

In FIG. 8, a field-effect thin film transistor 1a of this preparation example is a top-gate thin film transistor, and is used in a TFT substrate or the like.

On the glass substrate 10, an IZO (registered trademark) with a large electroconductivity was stacked in a thickness of 40 nm by a sputtering film forming method. Then, a photoresist was applied, and by using a photomask, patterns of the source electrode 22, the drain electrode 23 and the wiring were exposed to light, followed by development with a developer. Then, by etching using a PAN-based etching solution (91.4 wt % of phosphoric acid, 3.3 wt % of nitric acid, and 5.3 wt % of acetic acid) of 45° C., the source electrode 22, the drain electrode 23 and the wiring were formed.

Next, on the glass substrate 10, an amorphous zinc oxide (8 at %)/indium oxide (92 at %) film to be used as the channel layer was formed in a thickness of 50 nm. A pattern of the active layer was exposed to light by means of a photomask, and developed with a developer. Then, as an oxalic acid-based etching solution, etching was conducted using ITO-06N (Kanto Kagaku Kabushiki Kaisha) of 45° C. Subsequently, crystallization was conducted at 280° C. for one hour in air to form the crystalline oxide 21. This crystalline oxide 21 had an electron carrier concentration of $0.7 \times 10^{16}/cm^3$, showing that it was less than $10^{16}/cm^3$.

Next, on the crystalline oxide 21, the gate-insulating film 24 composed of $SiO_2$ was formed.

Subsequently, on the gate electrode 25, IZO was formed into a film. Then, the gate electrode 25 was formed by a photolithographic method and etching.

The field-effect thin film transistor 1a of this preparation example had the following properties. Field-effect mobility; 25 $cm^2$/V·sec, on-off ratio; $10^5$ or more; threshold voltage (Vth); +2.0V (normally off) The output characteristics showed a clear pinch-off. That is, it had sufficiently good transistor characteristics. Further, by using a transparent electrode, light transmittance could be improved.

PREPARATION EXAMPLE 3 OF THE
FIELD-EFFECT THIN FILM TRANSITOR

The field-effect thin film transistor 1a of this preparation example is a top-gate thin film transistor as shown in FIG. 8.

At first, on the glass substrate 10, Au and IZO with a high electroconductivity (containing 10.7 wt % of zinc oxide) were respectively formed into a thickness of 50 nm by a sputtering film-forming method (Ar: 100%, total pressure: 0.3 Pa). Then, a photoresist was applied, and by using a photomask, patterns of the source electrode 22, the drain electrode 23 and the wiring were exposed to light, followed by development with a developer. Then, by etching with a PAN-based etching solution of 45° C. (91.4 wt % of phosphoric acid, 3.3 wt % of nitric acid and 5.3 wt % of acetic acid), the source electrode 22, the drain electrode 23 and the wiring were formed.

Next, on the glass substrate 10, an amorphous zinc oxide (5 at %)/indium oxide (95 at %) film to be used as the channel layer was formed in a thickness of 100 nm. A pattern of the active layer was exposed to light by means of a photomask, and developed with a developer. Then, etching was conducted using ITO-06N (Kanto Kagaku Kabushiki Kaisha) of 45° C. as an oxalic acid-based etching solution. Subsequently, crystallization was conducted at 280° C. for one hour in argon gas flow containing 30 vol % of oxygen to form the crystalline oxide 21. This crystalline oxide 21 had an electron carrier concentration of $0.6 \times 10^{16}/cm^3$, showing that it was less than $10^{16}/cm^3$.

Next, on the crystalline oxide 21, the gate-insulating film 24 composed of $SiO_2$ and SiNx was formed.

Subsequently, on the gate electrode 25, Al was formed into a film. Then, the gate electrode 25 was formed by a photolithographic method and etching.

The field-effect thin film transistor 1a of this preparation example had the following properties. Field-effect mobility; 20 $cm^2$/V·sec, on-off ratio; $10^4$ or more; threshold voltage (Vth); +1.5V (normally off) The output characteristics showed a clear pinch-off. That is, it had sufficiently good transistor characteristics. Further, by using a transparent electrode, light transmittance could be improved.

PREPARATION EXAMPLE 4 OF THE
FIELD-EFFECT THIN FILM TRANSISTOR

The field-effect thin film transistor 1a of this example is a top-gate thin film transistor as shown in FIG. 8.

On the glass substrate 10, IZO having a large electric conductivity (containing 10.7 wt % of zinc oxide) was stacked into a thickness of 60 nm by a sputtering film-forming method (Ar: 99%, $O_2$: 1%, total pressure: 0.3 Pa). Then, a photoresist was applied, and by using a photomask, patterns of the source electrode 22, the drain electrode 23 and the wiring were exposed to light, followed by development with a developer. Then, by etching with a PAN-based etching solution of 45° C. (91.4 wt % of phosphoric acid, 3.3 wt % of nitric acid and 5.3 wt % of acetic acid), the source electrode 22, the drain electrode 23 and the wiring were formed.

Next, on the glass substrate 10, an amorphous zinc oxide (5 at %)/ytterbium oxide (1 at %)/indium oxide (94 at %) film was formed as the channel layer was stacked into a thickness of 120 nm. A pattern of the active layer was exposed to light by means of a photomask, and developed with a developer. Then, etching was conducted using, as an oxalic acid-based etching solution, ITO-06N (Kanto Kagaku Kabushiki Kaisha) of 45° C.

Then, on the above-mentioned channel layer, the SiNx film was formed by the CVD method at a substrate temperature of 320° C., thereby forming the gate-insulating film 24. At this time, the substrate temperature was elevated to 320° C. The conductive amorphous zinc oxide (5 at %)/ytterbium oxide (1 at %)/zinc oxide ytterbium oxide (94 at %) film was crystallized. By the X-ray diffraction, a clear peak derived from the bixbyite structure of indium oxide was observed, whereby the crystalline oxide 21 was completed. The electron carrier concentration of the crystalline oxide 21 was $0.4 \times 10^{16}/cm^3$, showing that it was less than $10^{16}/cm^3$.

Next, on the gate electrode 25, Al was formed into a film, and the gate electrode 25 was formed by a photolithographic method and etching.

The field-effect thin film transistor 1a of this preparation example had the following properties. Field-effect mobility; 30 $cm^2$/V·sec, on-off ratio; $10^6$ or more; threshold voltage (Vth); +0.5V (normally off) The output characteristics showed a clear pinch-off. That is, it had sufficiently good transistor characteristics. Further, by using a transparent electrode, light transmittance could be improved. In the field-effect thin film transistor 1a of this preparation example, disadvantages such as short circuits of a gate or change in current with the passage of time could be suppressed. That is, according to the invention, a highly reliable TFT panel which is suited to the driving of a large-area liquid crystal panel or an organic EL panel can be prepared.

PREPARATION EXAMPLE 5 OF A
FIELD-EFFECT THIN FILM TRANSISTOR

The field-effect thin film transistor 1a of this preparation example is a top-gate thin film transistor as shown in FIG. 8.

First, instead of the glass substrate 10, plastic films (for example, a polyethylene terephthalate film) were used. First, on this plastic film, a surface coat layer (for example, an amorphous silicon nitride layer: 300 nm) was stacked. The materials of the surface coat layer are not limited to amorphous silicon nitride. For example, amorphous silicon oxide, titanium oxide, aluminum oxide, magnesium oxide or the like can be used. In this way, the adhesion with the substrate (substrate, film or the like) was improved, and irregularities on the substrate surface were decreased, whereby the current leakage of the device could be suppressed.

Then, by a sputtering film-forming method (Ar: 100%, total pressure: 0.3 Pa), Au and IZO (containing 10.7 wt % of zinc oxide) with a large electroconductivity were respectively stacked in a thickness of 30 nm. Then, a photoresist was applied, and the patterns of the source electrode 22, the drain electrode 23 and the wiring were exposed to light, followed by development with a developer. Then, by etching with a PAN-based etching solution of 45° C. (91.4 wt % of phosphoric acid, 3.3 wt % of nitric acid and 5.3 wt % of acetic acid), the source electrode 22, the drain electrode 23 and the wiring were formed.

Then, by a sputtering method (substrate temperature: room temperature), on the plastic film, the oxide 21 (zinc oxide (2 at %)+indium oxide (98 at %)) as the channel layer was formed into a film. The pattern of an active layer was exposed to light by using a photomask, followed by development with a developer.

Then, etching was conducted using, as an oxalic acid-based etching solution, ITO-06N (Kanto Kagaku Kabushiki Kaisha) of 45° C. That is, as a result of X-ray diffraction of the thin film of zinc oxide (2 at %)+indium oxide (98 at %), no peak derived from the bixbyite structure of indium oxide was observed, showing that this was an amorphous film. Subsequently, the substrate was crystallized by heating at 180° C. to obtain the crystalline oxide 21. The resulting crystalline oxide 21 had an electron carrier concentration of $0.9 \times 10^{18}/cm^3$, showing that it was less than $10^{18}/cm^3$.

On this crystalline oxide 21, an interfacial passivasion layer (amorphous silicon oxide layer: 3 nm) was deposited, and shaped by a photolithographic method and etching. The materials of the passivasion layer is not limited to amorphous silicon oxide. For example, amorphous silicon nitride, titanium oxide, aluminum oxide, magnesium oxide or the like can be used. In this way, by forming an interfacial passivasion layer, it effectively acts on the gate-insulating film 24, whereby current leakage can be suppressed.

Instead of forming the interfacial passivasion layer, an interfacial passivasion treatment may be conducted. That is, even when an oxygen plasma treatment ($O_2$: 5 sccm, 20 W, 20 sec) is conducted for the uppermost surface of the crystalline oxide 21 as the channel layer, the interface with the gate-insulating layer can be improved, and current leakage of the device can be suppressed. If the interfacial passivasion treatment is formed and the interfacial passivation layer is formed, current leakage of the device can more effectively suppressed.

Next, on the crystalline oxide 21, the gate-insulating film 24 composed of $SiO_2$ was formed.

Subsequently, Al was formed into a film on the gate electrode 25. Then, the gate electrode 25 was formed by a photolithographic method and etching.

The field-effect thin film transistor 1a of this preparation example had the following properties. Field-effect mobility; 25 $cm^2/V \cdot sec$, on-off ratio; $10^5$ or more; threshold voltage (Vth); +0.5V (normally off) The output characteristics showed a clear pinch-off. That is, it had sufficiently good transistor characteristics. Further, by using a transparent electrode, light transmittance could be improved.

Hereinabove, the semiconductor device of the second aspect of the invention was explained with reference to preferable embodiments. The semiconductor device according to the second aspect of the invention is not limited to the above-mentioned embodiments. It is needless to say that various modifications are possible within the scope of the invention.

For example, the field-effect thin film transistor is not limited to a bottom-gate or top-gate field-effect thin film transistor. Field-effect transistors varying in structure may be used.

EXAMPLES

The first aspect of the invention will be explained with reference to the examples, while comparing with the comparative examples. The examples only show preferable examples, and the invention is not restricted to the examples. Therefore, modifications based on the technical idea of the first aspect of the invention, and other examples thereof are included in the first aspect of the invention.

The method for measuring the properties of a sputtering target prepared in Examples and Comparative Examples are given below.

(1) Density

Calculated from the weight and the external dimension of a piece of a target which had been cut into a predetermined size.

(2) Bulk Resistance of a Target

Measured by the four probe method by using a resistivity meter (Loresta, manufactured by Mitsubishi Chemical Corporation).

(3) Structure of an Oxide Present in a Target

The structure of an oxide was identified by analyzing the chart obtained by the X-ray diffraction.

Example 1

950 g of indium oxide and 50 g of gadolinium oxide (raw material powder) were pulverized with mixing for about 5 hours by using a dry beads mill, whereby mixed powder was prepared.

The resulting mixed powder was put in a mold with a dimension with a diameter of 10 mm. After conducting preliminary molding at a pressure of 100 $kg/cm^2$ by means of a mold pressing machine, the resultant was compacted to a molded product at a pressure of 4 $t/cm^2$ by means of a cold isostatic pressing machine.

The molded product was fired at 1250° C. for 15 hours, whereby a sintered body was produced.

Figure 9:
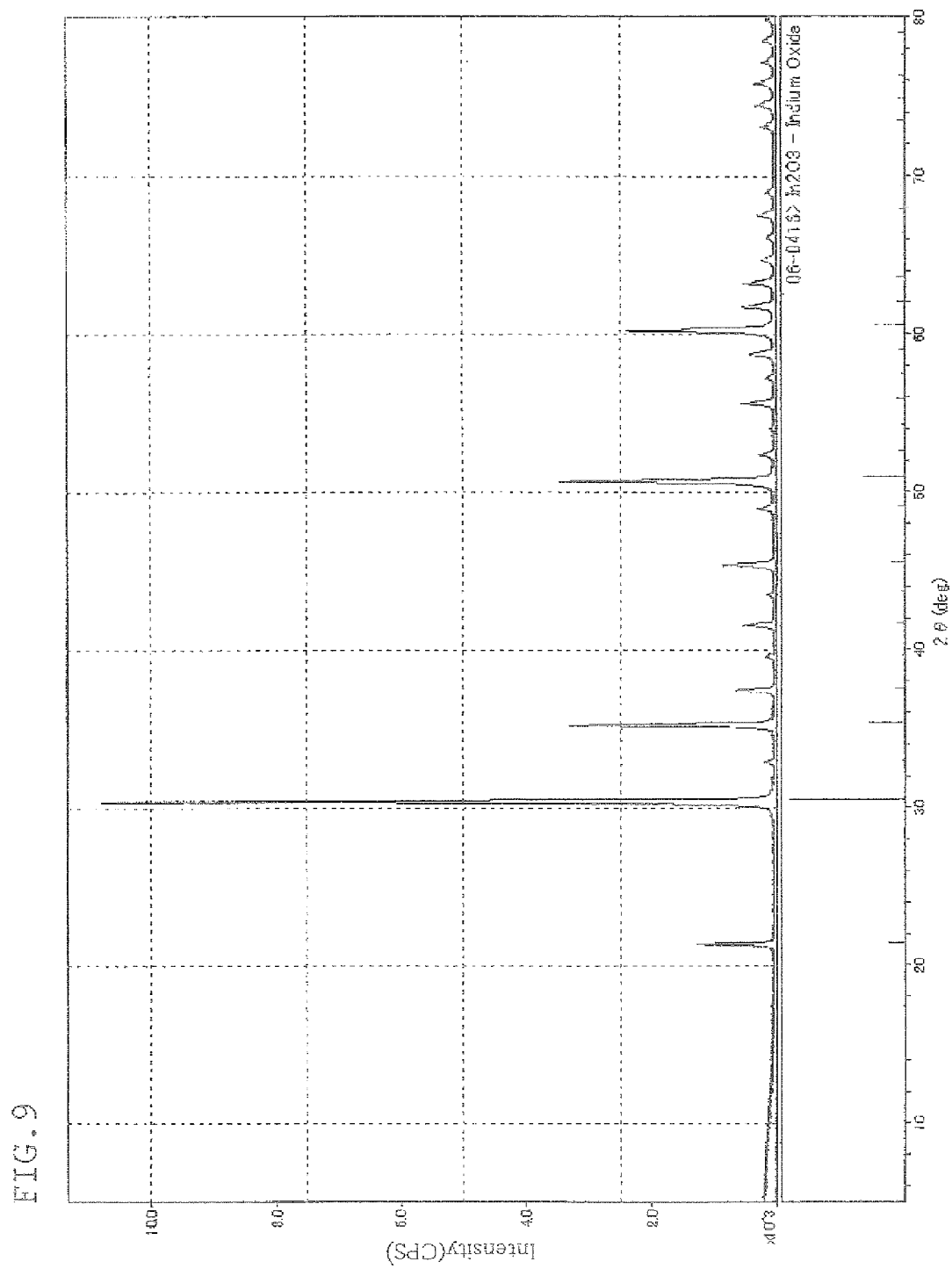
FIG. 9 is an X-ray chart of a target produced in Example 1.

For the resulting sintered body, an X-ray diffraction measurement was conducted. As a result, only an X-ray diffraction peak derived from $In_2O_3$ was observed, confirming that the resulting sintered body was substantially of a bixbyite structure. The X-ray diffraction chart of this sintered body is shown in FIG. 9.

The atomic ratio of this sintered body was measured by ICP (Inductivity Coupled Plasma) analysis, and it was found that Gd/(Gd+In)=4 at %. Further, the in-plane elemental distribution was evaluated by EPMA (Electron Probe Micro Analyzer). As a result, the dispersed state of In and Gd was confirmed. The composition thereof was substantially uniform.

The sintered body had a density of 6.95 $g/cm^3$ and a bulk resistance of 0.05 $\Omega cm$.

Example 2

A sintered body was produced in the same manner as in Example 1, except that 900 g of indium oxide and 100 g of dysprosium oxide were used as the raw material powder.

Figure 10:
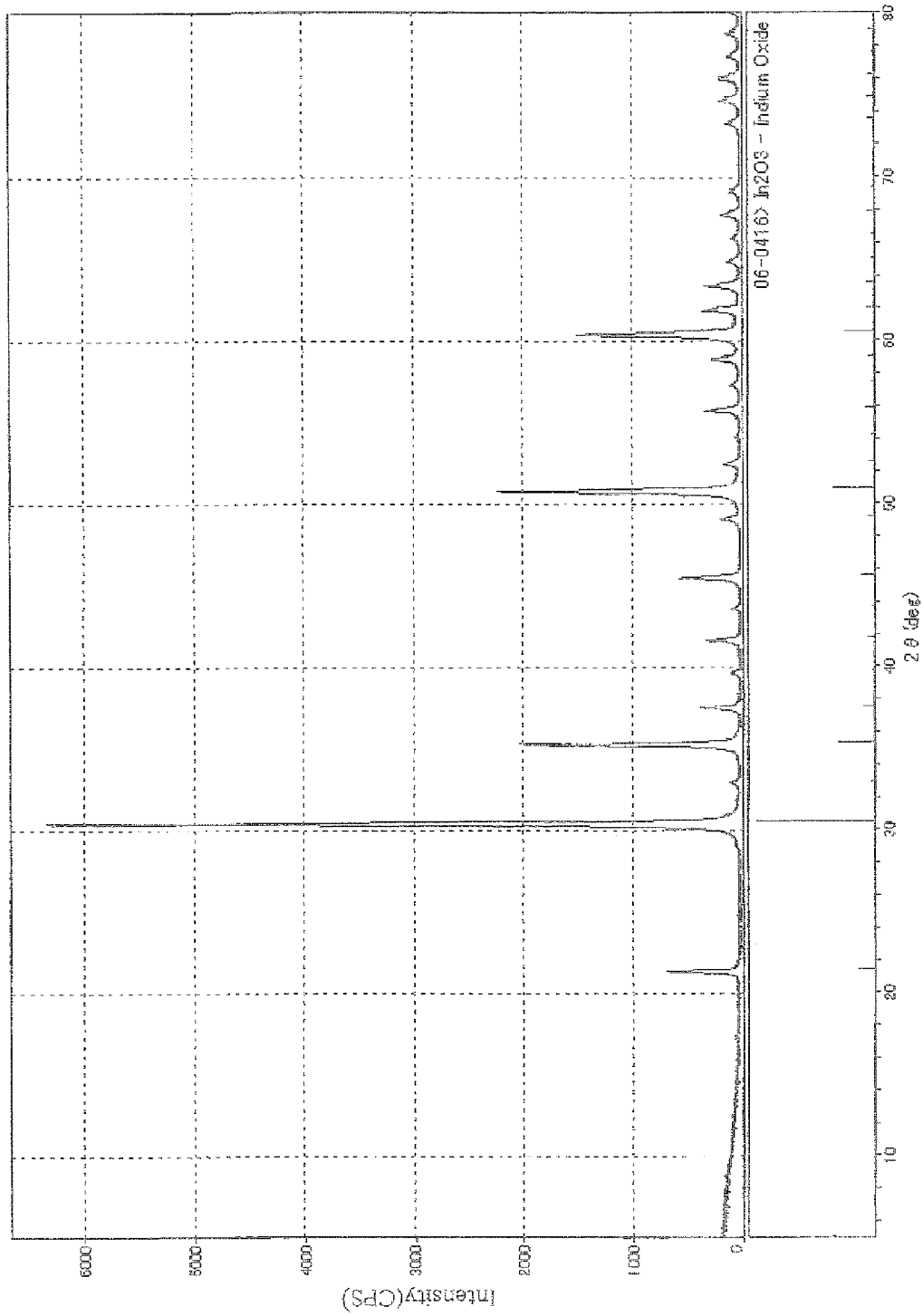
FIG. 10 is an X-ray chart of a target produced in Example 2.

An X-ray diffraction measurement was conducted for the resulting sintered body. As a result, only a diffraction peak derived from $In_2O_3$ was observed, confirming that the resulting sintered body was substantially of a bixbyite structure. The X-ray diffraction chart of this sintered body is shown in FIG. 10.

The atomic ratio of this sintered body was measured by ICP analysis, and it was found that Dy/(Dy+In)=7.6 at %. Further, the in-plane elemental distribution was evaluated by EPMA. As a result, the dispersed state of In and Dy was confirmed. The composition thereof was substantially uniform.

The sintered body had a density of 6.98 g/cm$^3$ and a bulk resistance of 0.004 Ωcm.

Example 3

A sintered body was produced in the same manner as in Example 1, except that 950 g of indium oxide and 50 g of holmium oxide were used as the raw material powder.

Figure 11:
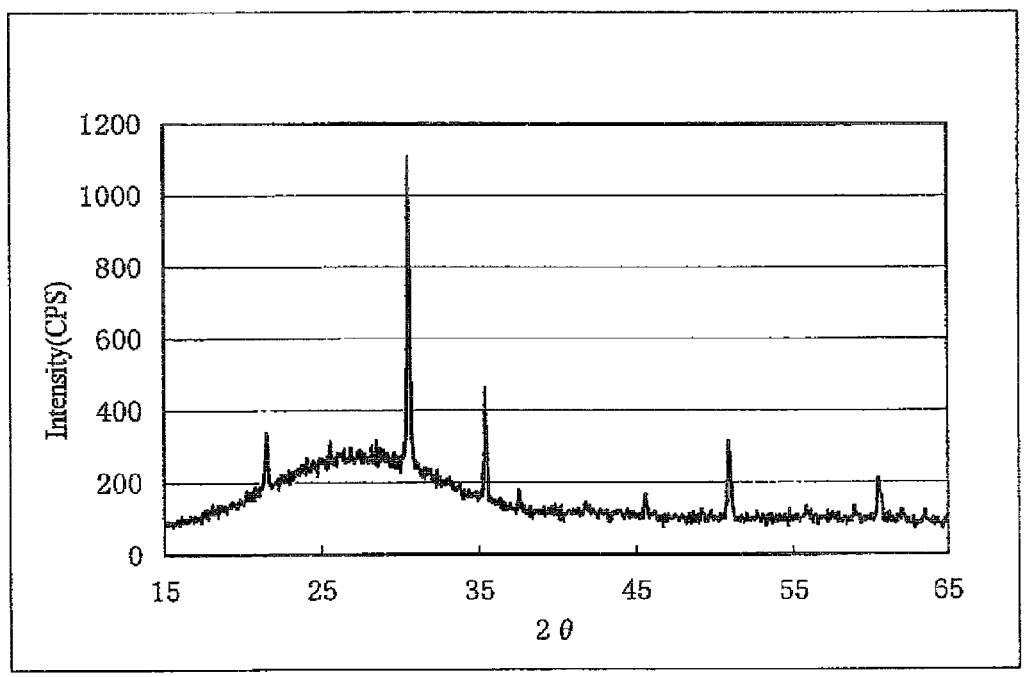
FIG. 11 is an X-ray chart of a target produced in Example 3.

An X-ray diffraction measurement was conducted for the resulting sintered body. As a result, only a diffraction peak derived from $In_2O_3$ was observed, confirming that the resulting sintered body was substantially of a bixbyite structure. The X-ray diffraction chart of this sintered body is shown in FIG. 11.

The atomic ratio of this sintered body was measured by ICP analysis, and it was found that Ho/(Ho+In)=3.7 at %. Further, the in-plane elemental distribution was evaluated by EPMA. As a result, the dispersed states of In and Ho were confirmed. The composition thereof was substantially uniform.

The sintered body had a density of 6.76 g/cm$^3$ and a bulk resistance of 0.004 Ωcm.

Example 4

A sintered body was produced in the same manner as in Example 1, except that 900 g of indium oxide and 100 g of erdium oxide were used as the raw material powder.

Figure 12:
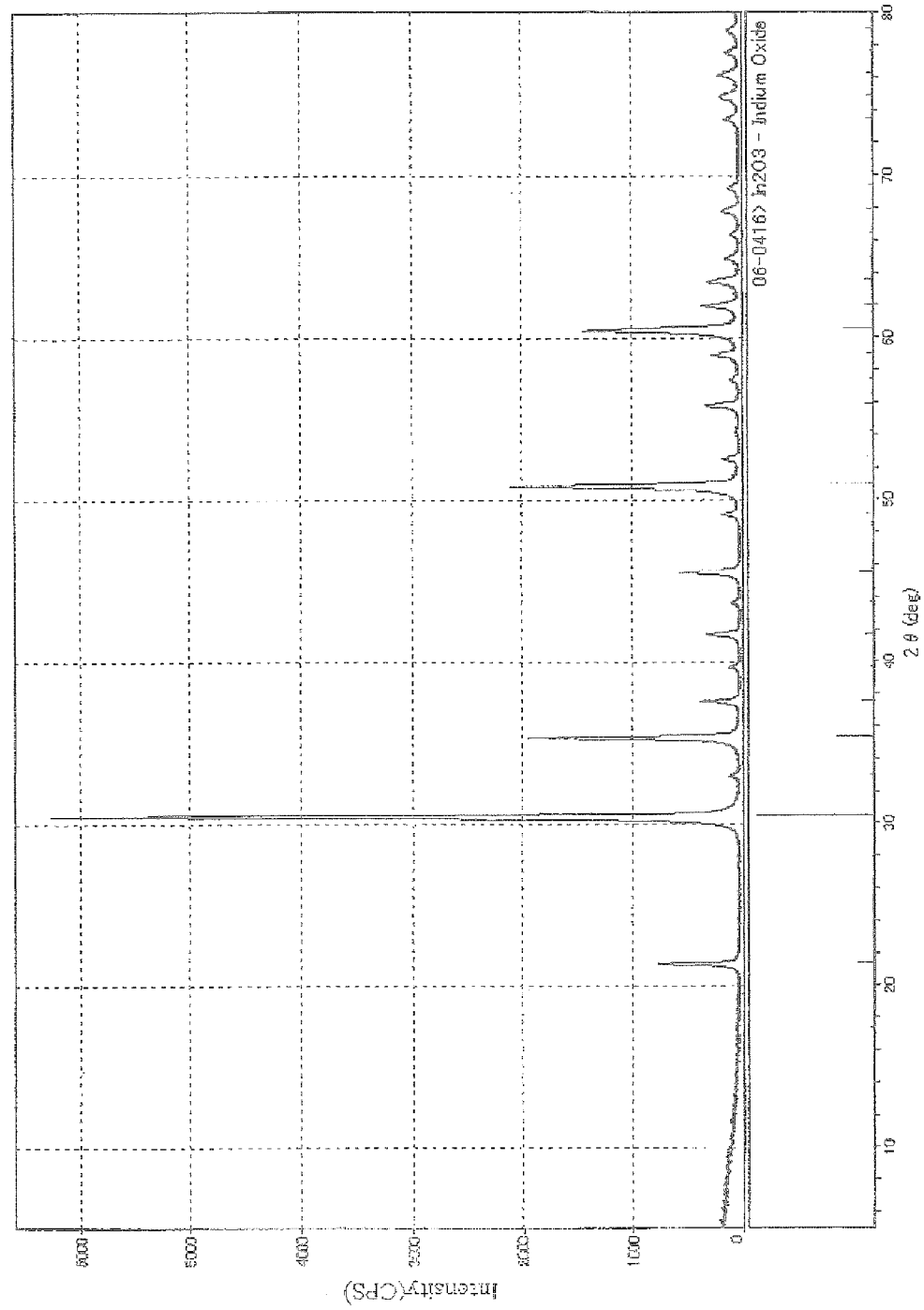
FIG. 12 is an X-ray chart of a target produced in Example 4.

An X-ray diffraction measurement was conducted for the resulting sintered body. As a result, only a diffraction peak derived from $In_2O_3$ was observed, confirming that the resulting sintered body was substantially of a bixbyite structure. The X-ray diffraction chart of this sintered body is shown in FIG. 12.

The atomic ratio of this sintered body was measured by ICP analysis, and it was found that Er/(Er+In)=7.5 at %. Further, the in-plane elemental distribution was evaluated by EPMA. As a result, the dispersed states of In and Er were confirmed. The composition thereof was substantially uniform.

The sintered body had a density of 6.86 g/cm$^3$ and a bulk resistance of 0.005 Ωcm.

Example 5

A sintered body was produced in the same manner as in Example 1, except that 900 g of indium oxide and 100 g of ytterbium oxide were used as the raw material powder.

Figure 13:
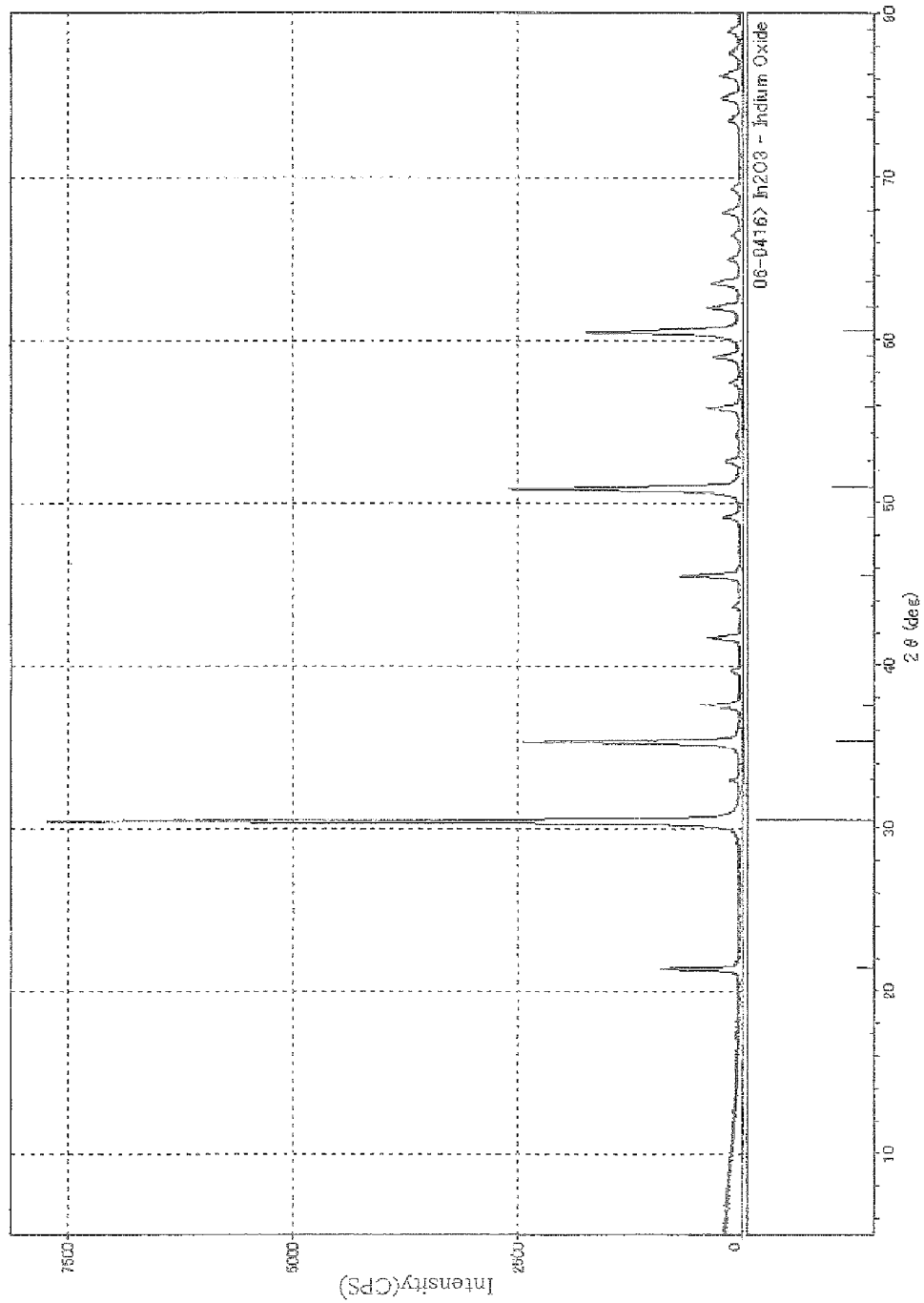
FIG. 13 is an X-ray chart of a target produced in Example 5.

An X-ray diffraction measurement was conducted for the resulting sintered body. As a result, only a diffraction peak derived from $In_2O_3$ was observed, confirming that the resulting sintered body was substantially of a bixbyite structure. The X-ray diffraction chart of this sintered body is shown in FIG. 13.

The atomic ratio of this sintered body was measured by ICP analysis, and it was found that Yb/(Yb+In)=7.3 at %. Further, the in-plane elemental distribution was evaluated by EPMA. As a result, the dispersed states of In and Yb were confirmed. The composition thereof was substantially uniform.

The sintered body had a density of 6.91 g/cm$^3$ and a bulk resistance of 0.004 Ωcm.

Example 6

A sintered body was produced in the same manner as in Example 1, except that 890 g of indium oxide, 100 g of ytterbium oxide and 10 g of zinc oxide were used as the raw material powder.

An X-ray diffraction measurement was conducted for the resulting sintered body. As a result, only a diffraction peak derived from $In_2O_3$ was observed, confirming that the resulting sintered body was substantially of a bixbyite structure. The atomic ratio of this sintered body was measured by ICP analysis, and it was found that Yb/(Yb+In)=7.2 at % and Zn/(Yb+In +Zn)=1.6 at %. Further, the in-plane elemental distribution was evaluated by EPMA. As a result, the dispersed states of In, Yb and Zn were confirmed. The composition thereof was substantially uniform.

The sintered body had a density of 6.84 g/cm$^3$ and a bulk resistance of 0.003 Ωcm.

Example 7

A sintered body was produced in the same manner as in Example 1, except that 949 g of indium oxide, 50 g of gadolinium oxide and 1 g of cerium oxide were used as the raw material powder.

An X-ray diffraction measurement was conducted for the resulting sintered body. As a result, only a diffraction peak derived from $In_2O_3$ was observed, confirming that the resulting sintered body was substantially of a bixbyite structure. The atomic ratio of this sintered body was measured by ICP analysis, and it was found that Gd/(Gd+In)=4 at %. The content of Ce relative to the total metal elements was 800 ppm. Further, the in-plane elemental distribution was evaluated by EPMA. As a result, the dispersed state of In and Gd was confirmed. The composition thereof was substantially uniform.

The sintered body had a density of 6.95 g/cm$^3$ and a bulk resistance of 0.001 Ωcm.

Examples 8 to 11

Sintered bodies were produced in the same manner as in Example 7, except that Ge, Ti, Zr and Nb were used instead of Ce. The resulting sintered bodies each had a bulk resistance of 0.005 Ωcm or less, showing that they were sintered bodies capable of being subjected to a DC magnetron sputtering method.

Example 12

A sintered body was produced in the same manner as in Example 1, except that 949 g of indium oxide, 50 g of gadolinium oxide and 1 g of tin oxide were used as the raw material powder.

An X-ray diffraction measurement was conducted for the resulting sintered body. As a result, only a diffraction peak derived from $In_2O_3$ was observed, confirming that the resulting sintered body was substantially of a bixbyite structure. The atomic ratio of this sintered body was measured by ICP analysis, and it was found that Gd/(Gd+In)=4 at %. The content of Sn relative to the total metal elements was 900 ppm. Further, the in-plane elemental distribution was evaluated by EPMA. As a result, the dispersed state of In and Gd was confirmed. The composition thereof was substantially uniform.

The sintered body had a density of 6.94 g/cm$^3$ and a bulk resistance of 0.05 Ωcm.

Comparative Example 1

A sintered body was produced in the same manner as in Example 1, except that 600 g of indium oxide and 400 g of gadolinium oxide were used as the raw material powder.

Figure 14:
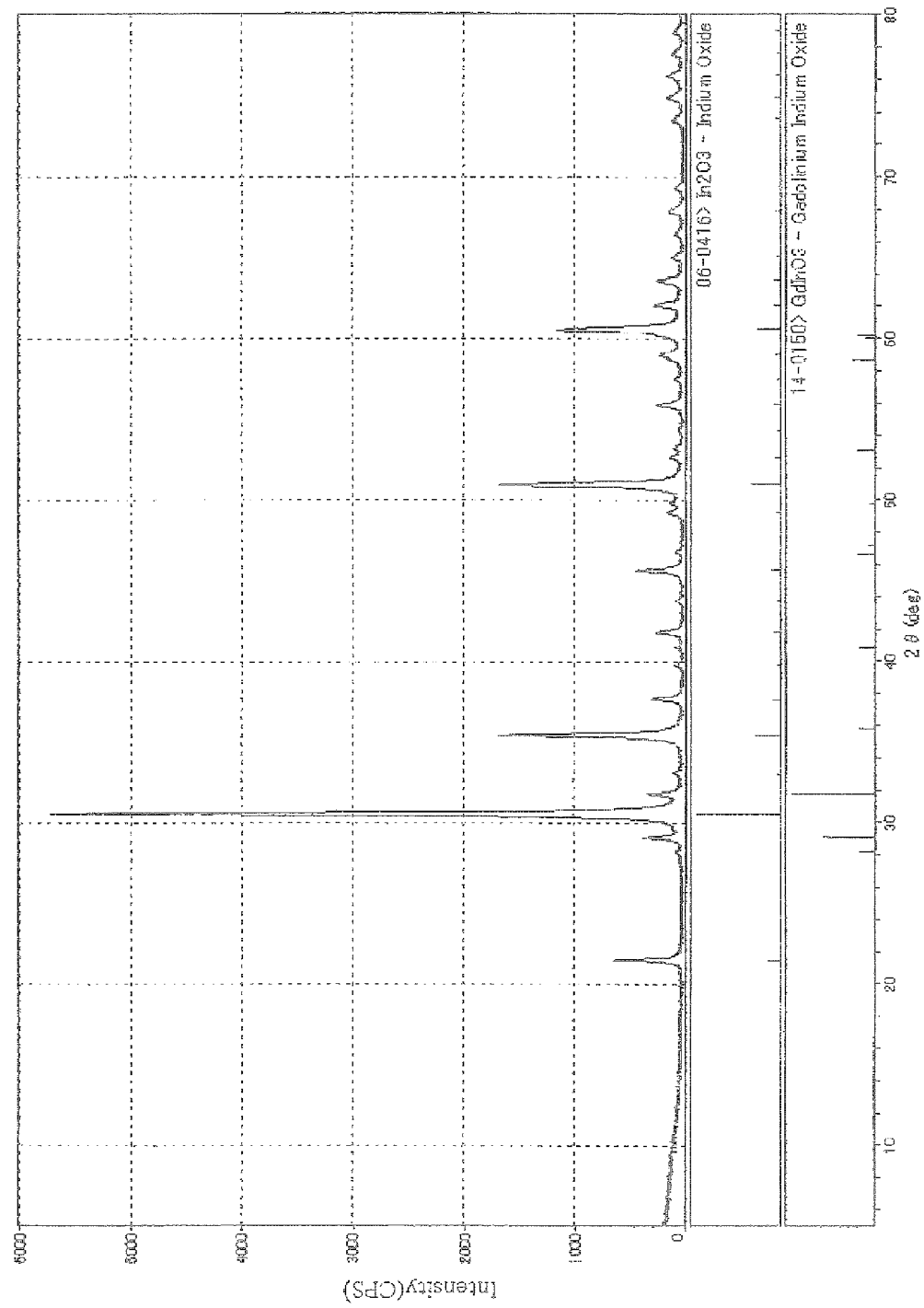
FIG. 14 is an X-ray chart of a target produced in Comparative Example 1.

As a result of an X-ray diffraction measurement, not only an X-ray diffraction peak derived from $In_2O_3$ but also a peak derived from $GdInO_3$ was observed. An X-ray diffraction chart is shown in FIG. 14.

The atomic ratio of this sintered body was measured by ICP analysis, and it was found that Gd/(Gd+In)=34 at %. Further, the in-plane elemental distribution was evaluated by EPMA. As a result, the dispersed state of In and Gd was confirmed. Gd was un-uniformly dispersed.

The sintered body had a density of 6.46 g/cm$^3$ and a bulk resistance of 1.5 Ωcm.

Example 13

The sintered body of Example 1 was processed to obtain a sputtering target with a diameter of 4 inches. This sputtering target was bonded to a backing plate, and then installed in a DC sputtering apparatus. In an argon gas atmosphere having an oxygen concentration of 1%, a 50 nm-thick thin film was formed at 100 W (1 W/cm$^2$) with the substrate temperature being room temperature.

The bulk resistance of this thin film was 0.008 Ωcm, which showed that this film was a thin film having a good conductivity.

An X-ray diffraction analysis was conducted for this thin film. No peak was observed, confirming that this thin film was of a good amorphous structure.

The atomic ratio of this thin film was measured by an ICP analysis, and was found to be Gd/(Gd+In)=4 at %.

This amorphous thin film was subjected to a heating treatment in the air at 240° C. for one hour. The bulk resistance of this heat-treated thin film was 4 Ωcm, confirming that this is a semiconductor film.

An X-ray diffraction analysis was conducted for the resulting oxide semiconductor film. As a result, only an X-ray diffraction peak derived from $In_2O_3$ was observed, confirming that the resulting oxide semiconductor thin film was substantially of a bixbyite structure.

Examples 14 to 17

Thin films were formed in the same manner as in Example 13, except that the sintered bodies produced in Examples 2 to 5 were used instead of the sintered body produced in Example 1.

Each of the resulting thin films was amorphous. In the same manner as in Example 13, each of the resulting amorphous thin films was subjected to a heating treatment. It was confirmed that the thin films which had been subjected to a heat treatment were a semiconductor film.

An X-ray diffraction measurement was conducted for each of the resulting oxide semiconductor films. As a result, only an X-ray diffraction peak derived from $In_2O_3$ was observed, confirming that the resulting oxide semiconductor films were substantially of a bixbyite structure.

Example 18

A thin film was formed in the same manner as in Example 13, except that the sintered body produced in Example 7 was used instead of the sintered body produced in Example 1.

The bulk resistance of this thin film was 0.0009 Ωcm, which showed that this film was a thin film having a good conductivity. An X-ray diffraction measurement was conducted for this thin film. Since no peak was observed, it was confirmed that this film was of a good amorphous structure.

The atomic ratio of this sintered body was measured by ICP analysis, and it was found that Gd/(Gd+In)=4 at %. The content of Ce relative to the total metal elements was 800 ppm.

The resulting amorphous thin film was subjected to a heat treatment in the same manner as in Example 13. The bulk resistance of the heat-treated thin film was 8 Ωcm, confirming that this thin film was a semiconductor film.

An X-ray diffraction measurement was conducted for this thin film. As a result, only an X-ray diffraction peak derived from $In_2O_3$ was observed, confirming that the resulting oxide semiconductor film was substantially of a bixbyite structure.

Examples 19 to 22

Thin films were formed in the same manner as in Example 13, except that the sintered bodies produced in Examples 8 to 11 were used instead of a sintered body produced in Example 1.

Each of the resulting thin films was amorphous. Each of the resulting amorphous thin films was subjected to a heat treatment in the same manner as in Example 13. It was confirmed that each of the thin films which were subjected to a heat treatment was a semiconductor film.

An X-ray diffraction measurement was conducted for this thin film. As a result, only an X-ray diffraction peak derived from $In_2O_3$ was observed, confirming that the resulting oxide semiconductor film was substantially of a bixbyite structure.

Example 23

A thin film was formed in the same manner as in Example 13, except that the sintered body produced in Example 6 was used instead of the sintered body produced in Example 1.

The bulk resistance of this thin film was 0.0006 Ωcm, which showed that this film was a thin film having a good conductivity. An X-ray diffraction measurement was conducted for this thin film. Since no peak was observed, it was confirmed that these films were of a good amorphous structure.

The atomic ratio of this sintered body was measured by ICP analysis, and it was found that Yb/(Yb+In +Zn)=7.0 at %, and Zn/(Yb+In +Zn)=1.5 at %.

The resulting amorphous thin film was subjected to a heat treatment in the same manner as in Example 13. The bulk resistance of the heat-treated thin film was 100 Ωcm, confirming that this thin film was a semiconductor film.

An X-ray diffraction measurement was conducted for this thin film. As a result, only an X-ray diffraction peak derived from $In_2O_3$ was observed, confirming that the resulting oxide semiconductor film was substantially of a bixbyite structure.

Industrial Applicability

The sputtering target according to the first aspect of the invention is suitable as a raw material of an oxide semiconductor film such as a switching element, a driving circuit element, etc. of a liquid display apparatus, a thin film electroluminescence display apparatus, an electrophoresis display, a moving powder display or the like. For example, an oxide semiconductor film for driving a liquid display and an oxide semiconductor film for driving an organic EL device can be obtained.

The semiconductor device using the crystalline oxide according to the second aspect of the invention can be widely used in various semiconductor devices, semiconductor apparatuses, circuits or the like. For examples, it can be widely applied to a flexible display such as a plastic film using a flexible material, an IC card, an ID tag or the like. A transistor using the transparent crystalline oxide film according to the second aspect of the invention is suitable as a switching element of a large-sized LCD or an organic EL display.

The invention claimed is:

1. A semiconductor device using a crystalline oxide comprising indium as a semiconductor, wherein the crystalline oxide has an electron career concentration of less than $10^{18}/cm^3$,
wherein the crystalline oxide comprises a positive trivalent element other than indium and the crystalline oxide is a polycrystalline oxide.

2. The semiconductor device according to claim 1, wherein the crystalline oxide is a nondegenerate semiconductor.

3. The semiconductor device according to claim 1, wherein the crystalline oxide comprises a positive divalent element.

4. The semiconductor device according to claim 3, wherein the positive divalent element is at least one element of Zn, Mg, Ni, Co and Cu.

5. The semiconductor device according to claim 3, wherein the atomic ratio of the number of the atoms of the positive divalent element ([M2]) to the number of the atoms of total metal elements contained in the crystalline oxide ([A]) is $0.001 \leq [M2]/[A] < 0.2$.

6. The semiconductor device according to claim 5, wherein the electron mobility to the electron carrier concentration of the crystalline oxide logarithmically proportionally increases by at least changing the atomic ratio of [M2] to [A].

7. The semiconductor device according to claim 1, wherein the positive trivalent element is at least one element of B, Al, Ga, Sc, Y and a lanthanoid element.

8. The semiconductor device according to claim 1, wherein the atomic ratio of the number of the atoms of the positive trivalent element ([M3]) to the number of the atoms of total metal elements contained in the crystalline oxide ([A]) is $0.001 \leq [M3]/[A] < 0.2$.

9. The semiconductor device according to claim 8, wherein the electron mobility to the electron carrier concentration of the crystalline oxide logarithmically proportionally increases by at least changing the atomic ratio of [M3] to [A].

10. The semiconductor device according to claim 1, wherein the crystalline oxide has a PAN resistance.

11. The semiconductor device according to claim 1, wherein the concentration of Li and Na contained in the crystalline oxide is 1000 ppm or less.

12. The semiconductor device according to claim 1, wherein the crystalline oxide is used as a channel layer in a field-effect transistor.

13. The semiconductor device according to claim 1, wherein the semiconductor is obtained by subjecting a sputtering target to sputtering, wherein said sputtering target is formed of an oxide sintered body comprising indium (In) and at least one element selected from gadolinium (Gd), dysprosium (Dy), holmium (Ho), erbium (Er) and ytterbium (Yb), and the oxide sintered body is substantially of a bixbyite structure.

14. The semiconductor device according to claim 13, wherein said oxide sintered body has an atomic ratio represented by M/(In +M) of 0.01 to 0.25, wherein M is the content of gadolinium (Gd), dysprosium (Dy), holmium (Ho), erbium (Er) and ytterbium (Yb).

15. The semiconductor device according to claim 13, wherein the sputtering target further comprises a positive divalent metal element and the content of the positive divalent metal element to the total amount of metal elements contained in the sputtering target is 1 to 10 at %.

16. The semiconductor device according to claim 15, wherein the positive divalent metal element is zinc (Zn) and/or magnesium (Mg).

17. The semiconductor device according to claim 13, wherein the sputtering target further comprises a metal element with an atomic valency of positive tetravalency or higher, wherein the content of the metal element with an atomic valency of positive tetravalency or higher to the total metal elements contained in the sputtering target is 100 ppm to 2000 ppm in atomic ratio.

18. The semiconductor device according to claim 17, wherein the metal element with an atomic valency of positive tetravalency or higher metal element is at least one element selected from germanium (Ge), titanium (Ti), zirconium (Zr), niobium (Nb) and cerium (Ce).

* * * * *